United States Patent
Yilmaz et al.

(10) Patent No.: US 9,322,633 B2
(45) Date of Patent: Apr. 26, 2016

(54) CAPACITIVE POSITION SENSOR

(71) Applicant: Atmel Corporation, San Jose, CA (US)

(72) Inventors: Esat Yilmaz, Santa Cruz, CA (US); Peter Sleeman, Waterlooville (GB); Samuel Brunet, Cowes (GB); Matthew Trend, Fareham (GB); Harald Philipp, Zug (CH)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 14/459,610

(22) Filed: Aug. 14, 2014

(65) Prior Publication Data
US 2015/0042615 A1 Feb. 12, 2015

Related U.S. Application Data

(63) Continuation of application No. 12/421,713, filed on Apr. 10, 2009, now Pat. No. 8,830,180.

(60) Provisional application No. 61/044,038, filed on Apr. 10, 2008.

(51) Int. Cl.
| | |
|---|---|
| *G06F 3/045* | (2006.01) |
| *G01B 7/00* | (2006.01) |
| *G01D 5/24* | (2006.01) |
| *G06F 3/044* | (2006.01) |
| *H03K 17/96* | (2006.01) |
| *G06F 3/041* | (2006.01) |

(52) U.S. Cl.
CPC .............. *G01B 7/003* (2013.01); *G01D 5/2405* (2013.01); *G06F 3/044* (2013.01); *G06F 3/0416* (2013.01); *H03K 17/9622* (2013.01); *G01B 2210/58* (2013.01); *G06F 2203/04112* (2013.01)

(58) Field of Classification Search
CPC .... G01B 7/003; G01B 2210/58; G06F 3/041; G06F 3/044
See application file for complete search history.

(56) References Cited

U.S. PATENT DOCUMENTS

| | | | |
|---|---|---|---|
| 4,879,461 | A | 11/1989 | Philipp |
| 5,602,486 | A | 2/1997 | Novak |
| 5,730,165 | A | 3/1998 | Philipp |
| 6,452,514 | B1 | 9/2002 | Philipp |
| 7,148,704 | B2 | 12/2006 | Philipp |

(Continued)

FOREIGN PATENT DOCUMENTS

| | | |
|---|---|---|
| CN | 101101525 | 1/2008 |
| EP | 1821175 | 8/2007 |

(Continued)

OTHER PUBLICATIONS

Touch Sensors Design Guide, ATMEL®, 10620E-AT42-09/09; dated Sep. 2009.

(Continued)

*Primary Examiner* — Matthew Sim
(74) *Attorney, Agent, or Firm* — Baker Botts L.L.P.

(57) ABSTRACT

In one embodiment, a sensor includes a plurality of drive electrodes running generally in a first direction. The sensor also includes a plurality of sense electrodes running generally in a second direction. The sense electrodes have branches running generally in the first direction. End portions of the adjacent branches of adjacent sense electrodes extend beyond one another to define respective coextensive portions of the branches.

6 Claims, 23 Drawing Sheets

(56) References Cited

U.S. PATENT DOCUMENTS

| | | | |
|---|---|---|---|
| 7,663,607 | B2 | 2/2010 | Hotelling |
| 7,875,814 | B2 | 1/2011 | Chen |
| 7,920,129 | B2 | 4/2011 | Hotelling |
| 8,031,094 | B2 | 10/2011 | Hotelling |
| 8,031,174 | B2 | 10/2011 | Hamblin |
| 8,040,326 | B2 | 10/2011 | Hotelling |
| 8,049,732 | B2 | 11/2011 | Hotelling |
| 8,179,381 | B2 | 5/2012 | Frey |
| 2006/0038791 | A1* | 2/2006 | Mackey ............... 345/173 |
| 2007/0062739 | A1 | 3/2007 | Philipp et al. |
| 2007/0257894 | A1 | 11/2007 | Philipp |
| 2008/0007539 | A1 | 1/2008 | Hotelling |
| 2008/0062139 | A1 | 3/2008 | Hotelling et al. |
| 2008/0062148 | A1* | 3/2008 | Hotelling et al. ......... 345/174 |
| 2008/0158178 | A1 | 7/2008 | Hotelling et al. |
| 2008/0246496 | A1 | 10/2008 | Hristov et al. |
| 2008/0273017 | A1 | 11/2008 | Woolley et al. |
| 2009/0109190 | A1 | 4/2009 | Elias |
| 2009/0194344 | A1 | 8/2009 | Harley et al. |
| 2009/0219257 | A1* | 9/2009 | Frey et al. ............ 345/173 |
| 2009/0315854 | A1 | 12/2009 | Matsuo |
| 2012/0242588 | A1 | 9/2012 | Myers |
| 2012/0242592 | A1 | 9/2012 | Rothkopf |
| 2012/0243151 | A1 | 9/2012 | Lynch |
| 2012/0243719 | A1 | 9/2012 | Franklin |

FOREIGN PATENT DOCUMENTS

| | | |
|---|---|---|
| EP | 1840714 | 10/2007 |
| WO | 2009007704 | 1/2009 |
| WO | 2009016382 | 2/2009 |
| WO | 2009027629 | 3/2009 |
| WO | 2012129247 | 9/2012 |

OTHER PUBLICATIONS

"Oct. 2009—Conductive Inkjet Technology", [online], [retrieved Apr. 20, 2010], retrieved from the internet: <URL:http://www.conductiveinkjet.com/about-us/latest-news/2009.aspx> (1 pg) Apr. 20, 2010 retrieved from internet.

"Cambrios Technologies Corporation Awarded Department of Defense Contract for Flexible Solar Cells", [online], [retrieved Apr. 20, 2010], Retrieved from the Internet: <URL:<http://www.cambrios.com/200/DOD_Release.htm>, Apr. 12, 2010 (2 pgs).

"New Silver Conductive Inks Target High-Growth Touch Screen and OLED Markets", [online], [retrieved Apr. 20, 2010, Retrieved from the internet: <URL: http://www2.dupont.com/MCM/en_US/news_events/article20100413.html>, 3 pgs. (Apr. 13, 2010).

"Printing of Antennas and Flexible Circuits", Core Applications & Technologies,©2009 Conductive Inkjet Technology Ltd., 23 pgs. (Oct. 2009).

Horteis, M., et al., "Fine Line Printed and Plated Contacts on High OHMIC Emitters Enabling 20% Cell Efficiency", 2009 34th IEEE Photovoltaic Specialists Conference (PVSC), (2009), 000060-000065, (2009).

The Patent Office of the People's Republic of China; Second Office Action and English Translation of Text of the Second Office Action for Chinese Patent Applicaton No. 200910134421.2; 15 pgs. (dated May 9, 2013).

Chinese First Office Action and English Translation of the Text of the First Office Action for Applicaton No. 200910134421.2 (15 pgs) dated Jul. 17, 2012.

Questel English Translation of Chinese Patent No. CN 101101525 (9 pgs) date printed Aug. 21, 2012.

U.S. Appl. No. 61/454,936, first named inventor: Scott A. Myers, filing date Mar. 21, 2011.

U.S. Appl. No. 61/454,950, first named inventor: S.B. Lynch, filing date Mar. 21, 2011.

U.S. Appl. No. 61/454,894, first named inventor: Rothkopf, filing date Mar. 21, 2011.

Atmel Corporation, "Touch Sensors Design Guide"; Jan. 22, 2009; http://www.atmel.com/dyn/resources/prod_documents/doc10620.pdf (Jan. 22, 2009).

Fifth Office Action Issued by State Intellection Property Office (China); Application No. 200910134421.2; Date of issuance: Dec. 22, 2014; 14 pages including translation.

* cited by examiner

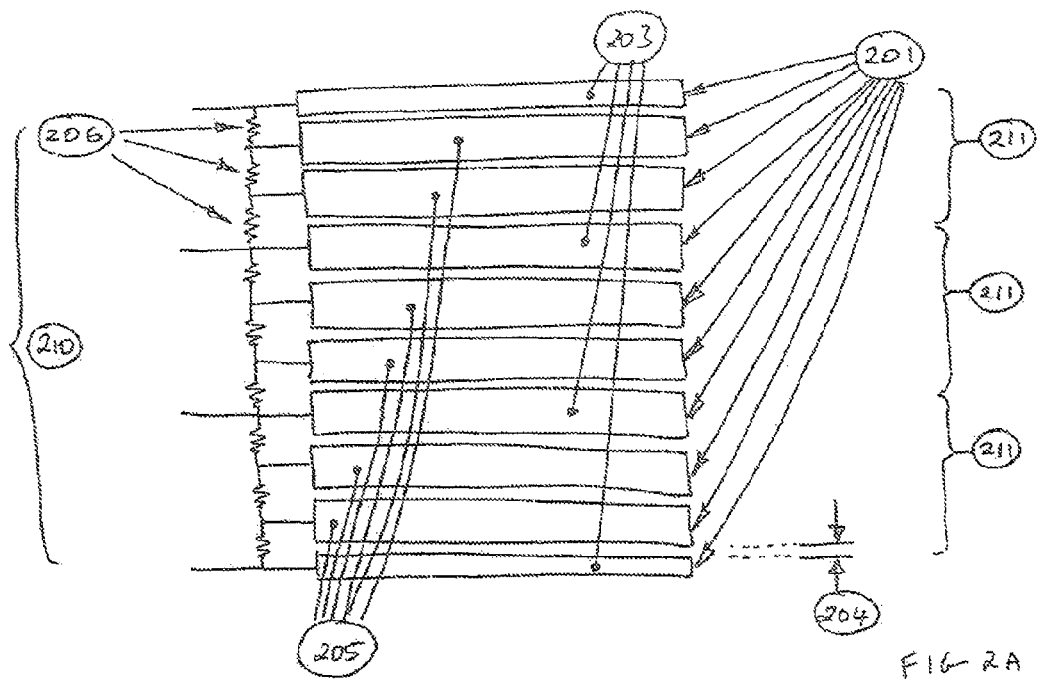
FIG 2A
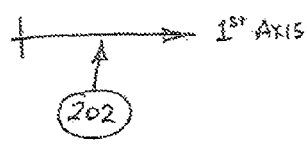
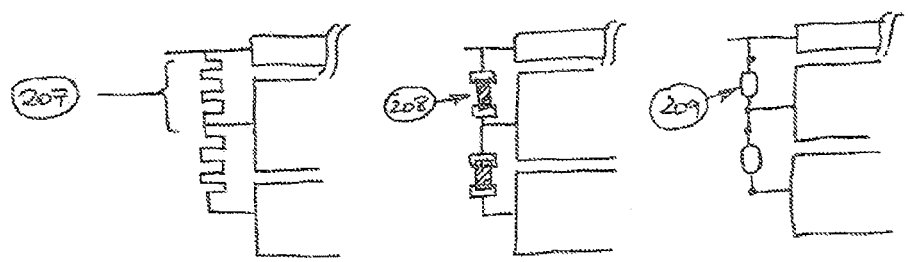
FIG 2B   FIG 2C   FIG 2D

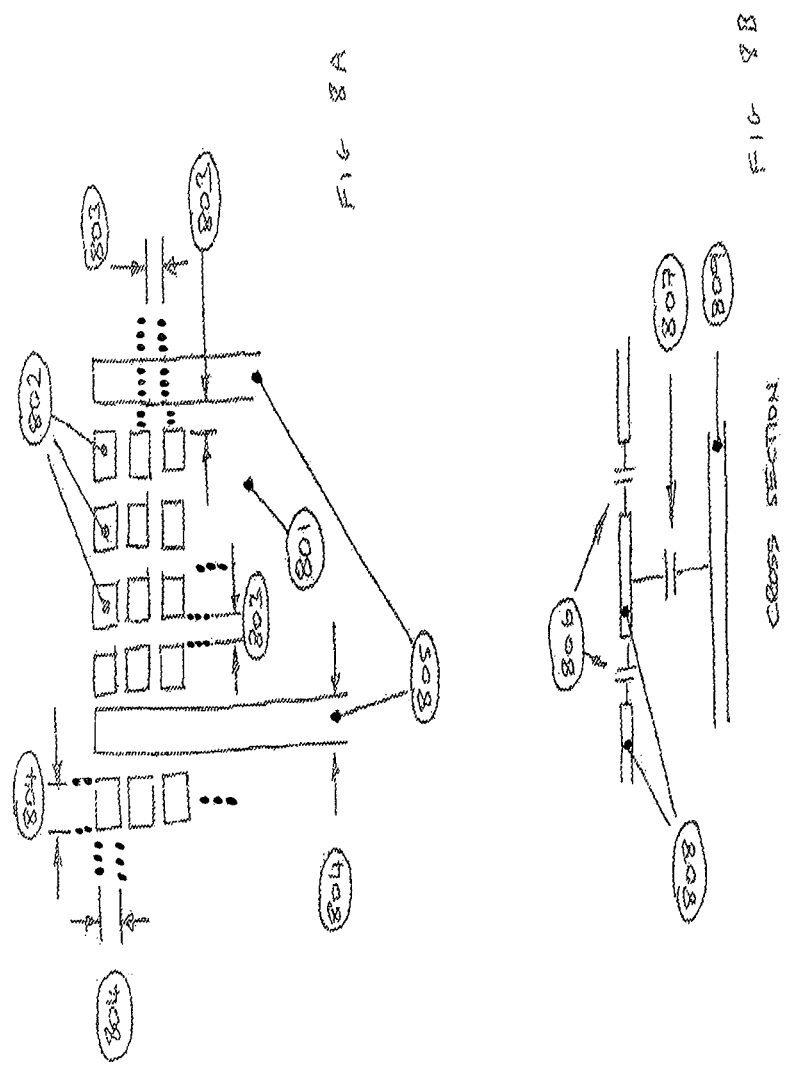

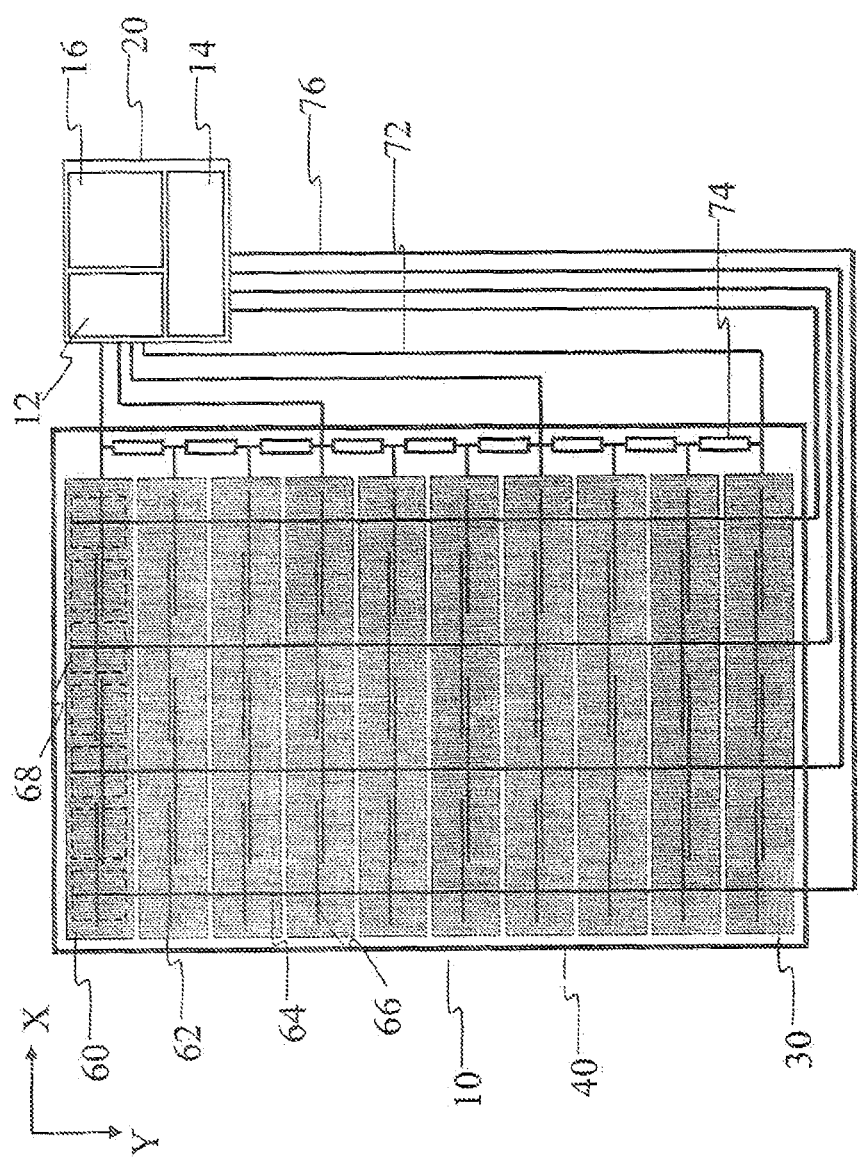

CAPACITIVE POSITION SENSOR

RELATED APPLICATIONS

This application is a continuation, under 35 U.S.C. §120, of U.S. patent application Ser. No. 12/421,713, filed Apr. 10, 2009, which claims the benefit, under 35 §119(e), of U.S. Provisional Patent Application Ser. No. 61/044,038, filed Apr. 10, 2008.

BACKGROUND OF THE INVENTION

The invention relates to capacitive position sensors. More particularly the invention relates to 2-dimensional capacitive position sensors of the type based on capacitive proximity sensing techniques. Such sensors may be referred to as 2-dimensional capacitive transducing (2DCT) sensors. 2DCT sensors are based on detecting a disturbance in a capacitive coupling of sensor electrodes caused by the proximity of a pointing object. A measured location for the disturbance corresponds to a measured position for the pointing object.

U.S. Pat. No. 6,452,514, U.S. Pat. No. 7,148,704 and U.S. Pat. No. 5,730,165 disclose prior art capacitive touch sensors.

2DCT sensors are typically actuated by a human finger, or a stylus. Example devices include touch screen and touch sensitive keyboards/keypads, e.g. as used for controlling consumer electronic devices/domestic appliances, and possibly in conjunction with an underlying display, such as a liquid crystal display (LCD), or cathode ray tube (CRT). Other devices which may incorporate 2DCT sensors include pen-input tablets and encoders used in machinery for feedback control purposes, for example. 2DCT sensors are capable of reporting at least a 2-dimensional coordinate, Cartesian or otherwise, related to the location of an object or human body part, by means of a capacitance sensing mechanism.

Devices employing 2DCT sensors have become increasingly popular and common, not only in conjunction with personal computers, but also in all manner of other appliances such as personal digital assistants (PDAs), point of sale (POS) terminals, electronic information and ticketing kiosks, kitchen appliances and the like. 2DCT sensors are frequently preferred to mechanical switches for a number of reasons. For example, 2DCT sensors require no moving parts and so are less prone to wear than their mechanical counterparts. 2DCT sensors can also be made in relatively small sizes so that correspondingly small, and tightly packed keypad arrays can be provided. Furthermore, 2DCT sensors can be provided beneath an environmentally sealed outer surface/cover panel. This makes their use in wet environments, or where there is a danger of dirt or fluids entering a device being controlled attractive. Furthermore still, manufacturers often prefer to employ interfaces based on 2DCT sensors in their products because such interfaces are often considered by consumers to be more aesthetically pleasing than conventional mechanical input mechanisms (e.g. push-buttons).

WO 2009/027629, published on 5 Mar. 2009, describes a capacitive touch sensor comprising a dielectric panel overlying a drive electrode with two sense electrodes. One of the sense electrodes is positioned to be shielded from the drive electrode by the first sense electrode, so that the first sense electrode receives the majority of the charge coupled from the drive electrode and the second sense electrode primarily registers noise. A sensing circuit including two detector channels is connected to the first (coupled) and second (noise) sense electrodes to receive signal samples respectively. The sensing circuit is operable to output a final signal obtained by subtracting the second signal sample from the first signal sample to cancel noise.

However, the methods described above increase the size and thickness, and may decrease the resolution of a device incorporating a display screen with a 2DCT sensor when it is more fashionable and desirable to produce smaller devices. Furthermore, additional steps are required during manufacture and as a result there is an increased cost due to further components being needed.

European patent EP 1821175 describes an alternative solution to reduce the noise collected on a 2DCT touch sensor. EP 1821175 discloses a display device with a touch sensor which is arranged so that the two dimensional touch sensor is overlaid upon a display device to form a touch sensitive display screen. The display device uses an LCD arrangement with vertical and horizontal switching of the LCD pixels. The touch sensing circuit includes a current detection circuit, a noise elimination circuit as well as a sampling circuit for each of a plurality of sensors, which are arranged to form the two-dimensional sensor array. The current detection circuit receives a strobe signal, which is generated from the horizontal and vertical switching signals of the LCD screen. The strobe signal is used to trigger a blanking of the current detection circuit during a period in which the horizontal switching voltage signal may affect the measurements performed by the detection circuit.

WO 2009/016382, published on 5 Feb. 2009, describes a sensor used to form a two dimensional touch sensor, which can be overlaid on a liquid crystal display (LCD) screen. As such, the effects of switching noise on the detection of an object caused by a common voltage signal of the LCD screen can be reduced. The sensor comprises a capacitance measurement circuit operable to measure the capacitance of the sensing element and a controller circuit to control charging cycles of the capacitance measurement circuit. The controller circuit is configured to produce charging cycles at a predetermined time and in a synchronous manner with a noise signal. For example, the charge-transfer cycles or 'bursts' may be performed during certain stages of the noise output signal from the display screen, i.e. at stages where noise does not significantly affect the capacitance measurements performed. Thus, the sensor can be arranged to effectively pick up the noise output from a display screen and automatically synchronize the charge-transfer bursts to occur during stages of the noise output cycle.

FIG. 21 of the accompanying drawings illustrates schematically a representative portion of the prior art electrode pattern of U.S. Pat. No. 6,452,514 or its equivalent WO 00/44018, published on 27 Jul. 2000. A plurality of drive electrodes X1, X2, X3 and X4 extending rowwise are arranged with a plurality of sense electrodes Y1, Y2, Y3 and Y4 extending columnwise, the intersections or crossings between X and Y electrodes forming a matrix or grid of sensing points or areas 220. It will be understood the X and Y electrodes do not literally intersect, but are offset in the vertical or Z direction, orthogonal to the plane of the drawing, being separated by a dielectric layer—typically a substrate panel which bears the X electrodes on one side and the Y electrodes on the other side. Each crossed electrode area 220 acts as a key so that the presence of a body such as a user's finger is detected as a result of a change in an amount of charge which is transferred between the two electrodes at the key location. With this arrangement, each of the electrodes X1, X2, X3 and X4 are driven with a drive circuit 118 via connections 105 and the other electrodes Y1, Y2, Y3 and Y4 are connected to a charge measurement circuit 118 via sense channels 116 which detects an amount of charge present at each of the sensing areas 220. It will be appreciated that for simplicity all of the control circuitry has been included in a single circuit 118. Such two dimensional capacitive transducing (2DCT) sensors are typically used with devices which include touch sensitive screens or touch sensitive keyboards/keypads which are used in for example in consumer electronic devices and domestic appliances. The 2DCT is of the so-called "active" or "mutual" type, in which proximity of an object is sensed by the changes induced in coupling between a drive electrode and one or more adjacent sense electrodes.

In the above 2DCT sensor, interpolation is used to determine the location of an object or finger adjacent the sensor. This is done by using the signals from the sense area being touched and the neighboring sense areas in a linear interpolation algorithm. However, for an interpolation to be accurate the electric field between adjacent drive electrodes should be linear or at least known. If the electrodes are placed close together it can be assumed that the electric filed between two electrodes is linear. That is to say that as you move away from an electrode, the field reduces in a linear fashion.

As the size of devices that use 2DCT sensors is increased, larger area 2DCT sensors are required. To increase the area of the 2DCT sensor while keeping the same resolution and accuracy (i.e. avoid using a non-linear interpolation method) the number of drive and sense electrodes could be increased. However, this means that the number of connections required from the control circuits is increased which in turn results in more expensive control circuits and increased acquisition times, since the acquisition of signals from each of the sensing areas typically needs to be carried out at least partially in series, since not all sensing areas can be polled simultaneously owing to restrictions on the number of drive and sense lines, and controller channels, i.e. chip pins.

FIG. 22 of the accompanying drawings illustrates schematically a representative portion of the prior art electrode pattern US 2008/0246496, published on 9 Oct. 2008. The figure illustrates a pattern of electrodes comprising longitudinal (bar) drive electrodes 152. The drive electrodes 152 are coupled via drive channels 158 and 160 to a controller (not shown in the figure). Each drive channel supplies drive signals to the group of four drive electrodes 152. The drive electrodes 152 are each connected to one another by a chain or row of resistors 170 having the same value. Alternatively, a single resistive strip could be used (not shown in figure). When operated the grouped drive electrodes will receive a different value drive signal. For example, when drive channel 160 is connected to a drive signal and drive channel 158 is connected to ground, the electrode connected directly to drive channel 160 will receive the applied signal value, the drive electrode below will receive two thirds of the applied signal value and the drive electrode below that will receive a third of the applied signal value. In the example described above, the fourth electrode connected directly to the drive channel 158 in the figure will be connected to ground. However, the above method can be repeated with drive channel 158 being connected to a drive signal and drive channel 160 being connected to ground. This effectively, allows four drive electrodes to be driven using only two drive channels. The arrangement shown in the figure can be repeated, and expanded to include more intermediate drive electrodes with respective resistors. However, the method described above is only suitable for the drive electrodes and is not transferable to the sense electrodes. The sense electrodes shown in the figure are interleaved with adjacent drive electrodes on a single surface. However, it will be appreciated that the drive electrodes shown in the figure could also be used for two-layer or dual layer designs.

It would therefore be desirable to provide an electrode pattern for a mutual capacitive or active type 2DCT sensor that can be used to allow the size of the overall sensitive area to be increased without needing to introduce more sense channels.

SUMMARY OF THE INVENTION

According to a first aspect of the invention there is provided a capacitive position sensor comprising: a plurality of drive electrodes extending in a first direction on a first plane; a plurality of sense electrodes extending in a second direction on a second plane offset from the first plane so that the sense electrodes cross the drive electrodes at a plurality of intersections which collectively form a position sensing array; wherein the sense electrodes have branches extending in the first direction part of the way towards each adjacent sense electrode so that end portions of the branches of adjacent sense electrodes co-extend with each other in the first direction separated by a distance sufficiently small that capacitive coupling to the drive electrode adjacent to the co-extending portion is reduced.

In one embodiment, for each drive electrode there is one set of sense electrode branches providing co-extending portions that occupy a region in between adjacent sense electrodes in the first direction. Providing sense electrode branches allow a sensor to be made which has a greater extent in the first direction for a given number of sense channels.

In other embodiments, for each drive electrode there are multiple sets of sense electrode branches that are offset from each other in the second direction, the multiple sets providing respective co-extending portions extending over different respective regions in the first direction. Increasing the number of sense electrode branches per drive electrode allows a sensor to be made which has ever greater extent in the first direction without having to increase the number of sense channels.

The sense electrodes are separated from each other in the first direction by a distance $P_{sense}$ and the drive electrodes are separated from each other in the second direction by a distance $P_{drive}$, wherein: $P_{sense}/P_{drive}=2m\pm 1$, where 'm' is the number of sets of sense electrode branches per drive electrode. The drive electrode pitch $P_{drive}$ is preferably of comparable dimension, or smaller, to the touch size of the touching object for which the sensor is designed. The touching object for which the sensor is designed may be a finger, e.g. of touch size 8-10 mm diameter. A stylus could also be used.

In plan view each drive electrode covers an area that fully encloses its associated sense electrode branches. In other words the 'footprint' of the sense electrodes lie within their associate drive electrode, or the periphery of the drive electrode lies outwardly beyond the sense electrodes associated therewith in at least the second direction and preferably also the first direction.

The drive electrodes preferably substantially entirely cover the first plane with individual ones of the drive electrodes being separated from neighboring drive electrodes by small gaps, wherein the gaps are preferably dimensioned to be sufficiently small to be invisible or almost invisible. The gaps are preferably less than around 100 micrometers, for example with ITO drive electrodes. Gap values of less than 90, 80, 70, 60 or 50 micrometers may also be preferred. With some electrode materials, such as PET, it may be difficult to fabricate such small gaps, so in some instances the gaps are preferably less than around 250, 200 or 150 micrometers The drive and sense electrodes may be the only electrode layers provided, a two-layer electrode construction leading to improved optical transmission for transparent embodiments such as used for touch-sensitive displays, thinner overall construction, and lower cost.

An important combination is the above-defined capacitive touch sensor with a display module. The display module, for example an LCD or OLED display panel, will typically by arranged below the first layer and distal the touch surface so that from top to bottom, or outside to inside the device, the components will be—dielectric layer the upper surface of which will be the touch surface—layer 2—substrate—layer 1—display panel, with the display panel being inside the device housing or outer shell. In a display application, the electrodes will likely be made of ITO.

In some embodiments, each drive and/or sense electrode is made of a continuous sheet of electrically conductive material, such as ITO or a metal. In other embodiments, each drive and/or sense electrode is made of a mesh or filigree pattern of interconnected lines of highly conductive material which collectively define each electrode. Still further embodiments use continuous sheets for one of the electrode types and meshes for the other electrode type. In the mesh approach, the interconnected lines preferably have a sufficiently small width so as to be invisible or almost invisible. They can then be made of material that is not inherently invisible, e.g. a metal such as copper, but still remain practically invisible.

The invention can be implemented to form a Cartesian 'xy' grid of touch sensor locations. In particular, the drive electrodes can extend in a first linear direction and the sense electrodes in a second linear direction transverse to the first linear direction so that the plurality of intersections form a grid pattern, for example a square, diamond or rectangular grid. The invention can also be implemented to form a polar 'rθ' grid, wherein the drive electrodes extend arcuately and the sense electrodes extend radially so that the plurality of intersections lie on one or more arcuate paths.

A further aspect of the invention relates to a touch sensitive panel for a capacitive touch sensor, the touch sensitive panel having a plurality of drive electrodes arranged on one side of a substrate in a first layer and a plurality of sense electrodes arranged on the other side of the substrate in a second layer so that the sense electrodes cross the drive electrodes at a plurality of intersections offset from each other by the thickness of the substrate, wherein the drive electrodes substantially entirely cover the first layer with individual ones of the drive electrodes being separated from neighboring drive electrodes by small gaps.

According to a second aspect of the invention there is provided a touch sensitive panel for a capacitive touch sensor, the touch sensitive panel having a plurality of drive electrodes arranged on one side of a substrate in a first layer and a plurality of sense electrodes arranged on the other side of the substrate in a second layer so that the sense electrodes cross the drive electrodes at a plurality of intersections offset from each other by the thickness of the substrate, wherein the sense electrodes have branches extending in the first direction part of the way towards each adjacent sense electrode so that end portions of the branches of adjacent sense electrodes coextend with each other in the first direction separated by a distance sufficiently small that capacitive coupling to the drive electrode adjacent to the co-extending portion is reduced.

According to a third aspect of the invention there is provided a method of sensing position of an actuation on a two-dimensional position sensor according to the first aspect of the invention, the method comprising:

applying drive signals to each of the plurality of drive electrodes;

measuring sense signals received from each of the plurality of sense electrodes representing a degree of capacitive coupling of the drive signals between the drive electrodes and each group of the sense electrodes;

determining the position in the first direction by an interpolation between sense signals obtained from each of the plurality of sense electrodes; and determining the position in the second direction by an interpolation between sense signals obtained by sequentially driving each of the plurality of drive electrodes with respective drive signals.

According to an alternative formulation of the invention, there is provided a capacitive sensor having an electrode pattern comprising a plurality of sense electrodes generally extending in a y direction across a sensing area and spaced apart in an x direction; wherein the extent in the y direction of each of the sense electrodes is herein referred to a spine; wherein each of the sense electrodes further comprises a plurality of extents spaced apart in the y direction herein referred to as first-branches that extend from the spine in the x direction and a −x direction opposing the x direction, whose extent from the spine in the second and −x direction is not more than the spacing between adjacent spines; and wherein the first-branches of each of the sense electrodes coextend over the same portion of the sensitive area as the first-branches of adjacent spines.

The electrode pattern may further comprise a plurality of drive electrodes extending in the x direction and interleaved in the y direction; wherein each of the drive electrodes extends in the first and x direction over the same portion of the sensing area as the first-branches of each of the sense electrodes.

The drive and sense electrodes may be disposed on opposing surfaces of a substrate.

The drive and sense electrodes may be disposed on a surface of different substrates.

The electrode pattern may further comprise a plurality of second-, third- or fourth-branches interleaved with the first-branches, wherein the coextension of branches from adjacent spines is offset from each other.

According to another aspect of the present invention there is provided a two-dimensional sensor comprising the electrode pattern, wherein the sensor may further comprise a controller comprising a drive unit for applying drive signals to the drive electrodes, and a sense unit for measuring sense signals received from each of the respective sense electrodes representing a degree of capacitive coupling of the drive signals between the drive electrodes and each of the sense electrodes.

The controller may further comprise a processing unit for calculating a position of an interaction with the sensitive area from an analysis of the sense signals obtained by applying drive signals to the drive electrodes.

The processing unit may be operable to determine position in the x direction by an interpolation between sense signals obtained from each of the plurality of sense electrodes.

The processing unit may be operable to determine position in the y direction by an interpolation between sense signals obtained by sequentially driving each of the plurality of drive electrodes with respective drive signals.

According to another aspect of the present invention there is provided a method of sensing position of an actuation on a two-dimensional position sensor comprising: an electrode pattern comprising a plurality of sense electrodes generally extending in a y direction across a sensing area and spaced apart in an x direction, wherein the extent in the y direction of each of the sense electrodes is herein referred to a spine, wherein each of the sense electrodes further comprises a plurality of extents spaced apart in the y direction herein referred to as first-branches that extend from the spine in the x direction and a −x direction opposing the x direction, whose extent from the spine in the second and −x direction is not more than the spacing between adjacent spines, and wherein the first-branches of each of the sense electrodes coextend over the same portion of the sensitive area as the first-branches of adjacent spines; a plurality of drive electrodes extending in the x direction and interleaved in the y direction; wherein each of the drive electrodes extends in the first and x direction over the same portion of the sensing area as the first-branches of each of the sense electrodes; the method comprising: applying drive signals to each of the plurality of drive electrodes; measuring sense signals received from each of the plurality of sense electrodes representing a degree of capacitive coupling of the drive signals between the drive electrodes and each group of the sense electrodes; determining the position in the x direction by an interpolation between sense signals obtained from each of the plurality of sense electrodes; and determining the position in the y direction by an interpolation between sense signals obtained by sequentially driving each of the plurality of drive electrodes with respective drive signals.

BRIEF DESCRIPTION OF THE DRAWINGS

For a better understanding of the invention and to show how the same may be carried into effect reference is now made by way of example to the accompanying drawings.

FIG. 2A shows an electrode pattern of drive electrodes with resistive elements according to an embodiment of the invention;

FIG. 2B shows a portion of the electrode pattern shown in FIG. 2A with a meander pattern of electrode material;

FIG. 2C shows a portion of the electrode pattern shown in FIG. 2A with screen printed resistors;

FIG. 2D shows a portion of the electrode pattern shown in FIG. 2A with discrete resistors;

FIG. 8A shows schematically in plan view a portion of the electrode pattern shown in FIG. 7A with infilling electrodes;

FIG. 8B is a cross-section through a part of FIG. 8A illustrating capacitive paths between infilling electrodes and an X electrode;

FIG. 12 shows a position sensor array according to an embodiment of the invention;

DETAILED DESCRIPTION

Described herein is a two-electrode layer construction for a capacitive touch screen or 2DCT sensor.

Figure 1A:
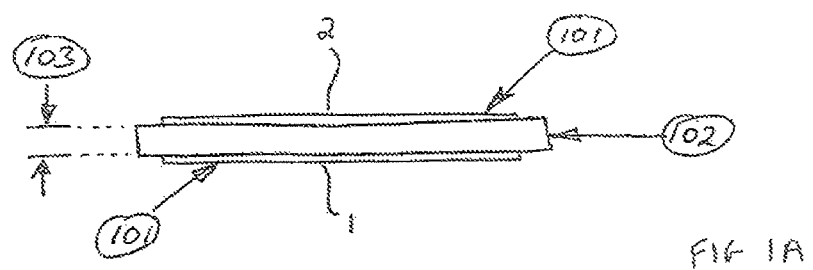
FIG. 1A shows a side view of a two-electrode layer capacitive touch screen according to an embodiment of the present invention.
Figure 1B:
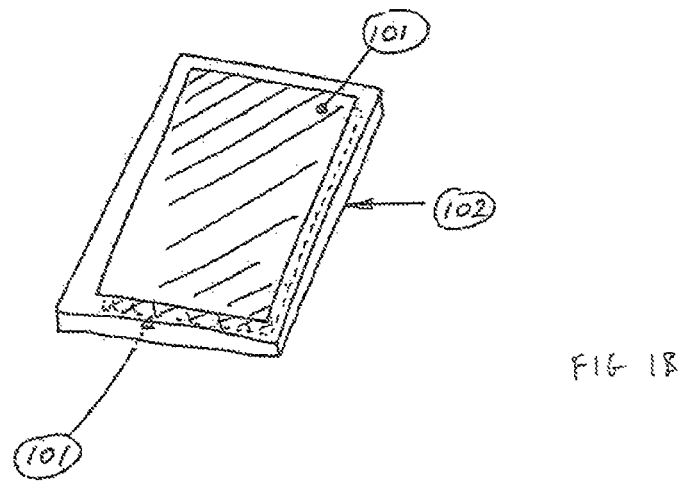
FIG. 1B shows a perspective view of a two-electrode layer capacitive touch screen according to an embodiment of the present invention.

FIGS. 1A and 1B are schematic drawings in side view and perspective view of a two-electrode layer construction for a capacitive touch screen or 2DCT sensor. The layers 101 can generally be made of any conductive material and the layers can be arranged to oppose each other on two sides of any isolating substrate 102 such as glass, PET, FR4 etc. The thickness of the substrate 103 is non critical. Thinner substrates lead to higher capacitive coupling between the layers which must be mitigated in the control chip. Thicker substrates decrease the layer to layer coupling and are generally more favorable for this reason (because the measured change in capacitance is a larger fraction of the layer-to-layer capacitance so improving signal-to-noise ratio). Typical substrate thickness' range from 10's to 100's of µm. Furthermore it will appreciated that a dielectric or isolating layer may be disposed overlying the two-electrode layer construction on Layer 2 to prevent an object adjacent the 2DCT sensor making contact with the surface of the layers. This isolating layer might be a glass or plastics layer.

Figure 1C:
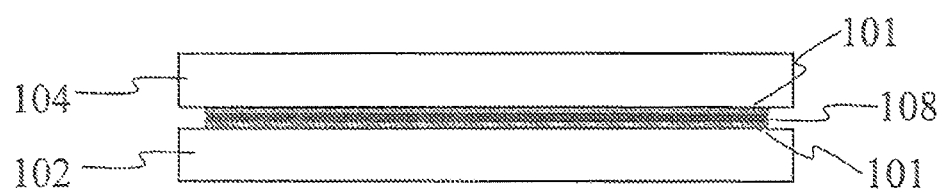
FIG. 1C shows a side view of a two-electrode layer capacitive touch screen according to another embodiment of the present invention.

FIG. 1C shows the side view of an alternative arrangement to the two-electrode layer construction for the capacitive touch screen or 2DCT sensor shown in FIG. 1A according another embodiment of the present invention. In FIG. 1C the layers 101 are disposed on the same surface of the isolating substrate 102, separated by an isolation layer 108. An additional dielectric or isolating layer 104 is disposed on the electrodes layers to prevent an object adjacent the 2DCT sensor making contact with the layers surface.

Figure 1D:
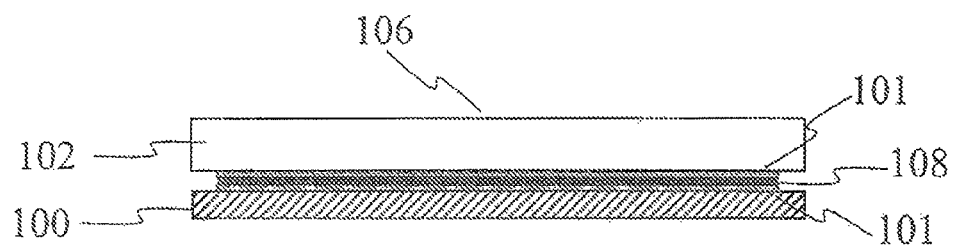
FIG. 1D shows a side view of a two-electrode layer capacitive touch screen according to another embodiment of the present invention.

FIG. 1D shows the side view of an alternative arrangement to the two-electrode layer construction for the capacitive touch screen or 2DCT sensor shown in FIG. 1A according another embodiment of the present invention. In FIG. 1D the layers 101 are disposed on the same surface of the isolating substrate 102, separated by an isolation layer 108. However, the electrode layers 101 are disposed on the surface of the isolating substrate that is farthest from the touch surface 106. A display panel 100 is also shown (with hatching) arranged below the substrate 102 that bears the electrode layers 101. It will be understood that the display panel in combination with the touch sensor make a touch screen. A display panel could also be fitted to an arrangement as shown in FIG. 1C above.

Figure 1E:
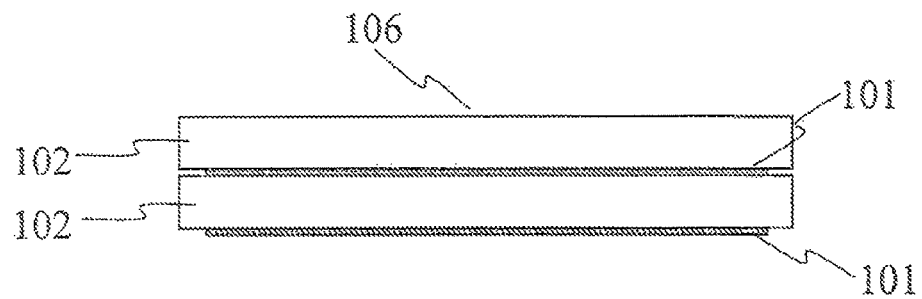
FIG. 1E shows a side view of a two-electrode layer capacitive touch screen according to an embodiment of the present invention.

FIG. 1E shows the side view of an alternative arrangement to the two-electrode layer construction for the capacitive touch screen or 2DCT sensor shown in FIG. 1A according another embodiment of the present invention. In FIG. 1E each of the layers 101 are disposed on a surface of two different isolating substrates 102. The two isolating substrates are brought together such that the two electrode layers 101 are separated from the touch surface 106 and are separated by one of the isolating substrates. A display panel could also be fitted to an arrangement as shown in FIG. 1E.

FIG. 2A shows an electrode pattern of drive electrodes with resistive elements according to an embodiment of the invention. Layer 1 is the layer farthest from the touch surface. On Layer 1 is an array of transmitting electrodes as shown in FIG. 2A. The electrodes 201 are arranged as a series of solid bars running along a first axis 202 or a y direction. A subset of the bars 203 is connected to the control chip so that they can be driven as the transmitter in the transmit-receive arrangement described above. The driven bars 203 include the outer most bars and then an even gap 204 between the remaining driven bars. The intermediate bars 205 are connected using resistive elements 206 in a chain 210, the ends of the chain being connected to two adjacent driven 203 bars. The driven bars 203 will be referred to as driven-X-bars and the resistively connected bars 205 will be referred to as resistive-X-bars.

FIGS. 2B, 2C and 2D show three different ways in which to form the resistive elements 206. Namely, the resistive elements 206 can be formed using the intrinsic resistance of the electrode material itself in a "meandered" pattern 207 at the edge of the touch screen (see FIG. 2B), or can be screen printed resistive material 208 at the edge (see FIG. 2C), or can be physical discrete resistors 209 either at the edge of the pattern (see FIG. 2D) or on a separate circuit. The latter option increases the interconnecting wiring substantially but can be advantageous in some designs.

The resistive chain 210 is used to act as a classic potential divider, such that the amplitude of the transmit signal is progressively attenuated between one driven-X-bar and the adjacent driven-X-bar. The set of driven and resistive bars so described will be referred to as a "segment" 211. Using this chain, if say driven-X-bar #1 303 is driven with a pulse train 305 relative to 0V 306 with a peak-to-peak voltage V 307, and driven-X-bar #2 304 is driven to 0V, then resistive-X-bars in between these two will be ratiometrically attenuated.

Figure 3:
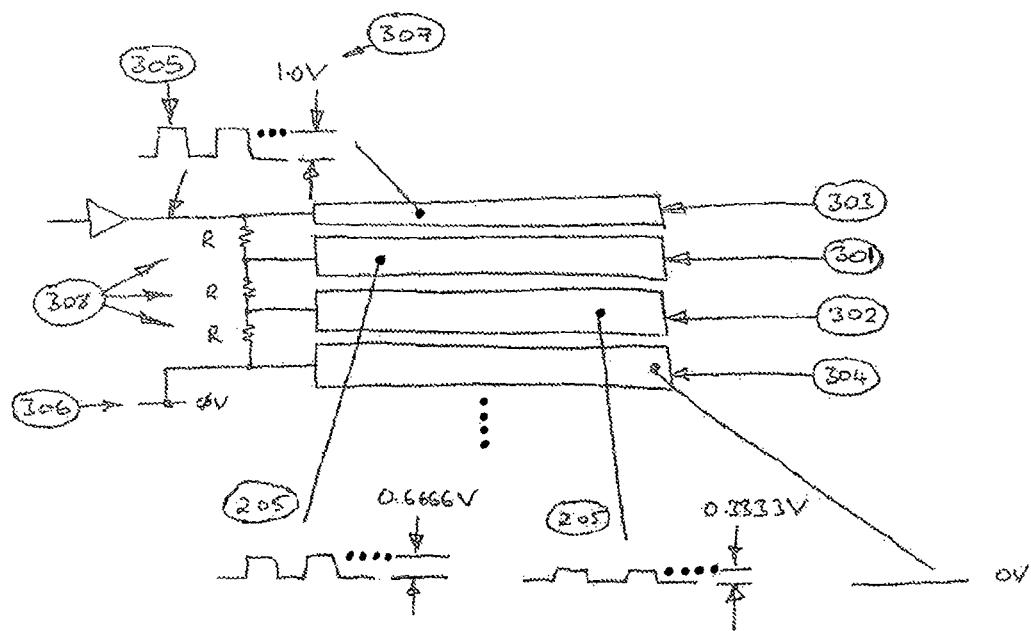
FIG. 3 shows a portion of the electrode pattern shown in FIG. 2B.

FIG. 3 shows a portion of the electrode pattern shown in FIG. 2B in which example, if there were 2 resistive-X-bars 205 and the resistor divider chain 210 is constructed of equal valued elements R 308, then the resistive-X-bar #1 301 will have a peak-to-peak voltage of 0.66666V and resistive-X-bar #2 will have a peak-to-peak voltage of 0.33333V. This has the effect of progressively weakening the electric field emitted from these resistive electrodes and so forms an interpolating effect for the capacitive changes within the segment between driven-X-bars. Hence, the linearity of the capacitive changes when moving within a segment is improved. Operating without resistive-X-bars is possible but the linearity is poor because the electric field decays over distance in a strongly non-linear fashion. By introducing evenly spaced resistive emitters emitting at an amplitude that is a linear division from the associated driven-X-bar, the field tends to "fill in" and form a better approximation to a linear system.

In the forgoing description Layer 1 is a pattern of transmit-electrodes, which may also be referred to as drive electrodes. The electrode pattern of Layer 1 may also be refereed to as x-electrodes. The drive electrodes include the driven-X-bars 203 and the intermediate X bars 205 or resistive-X-bars. Furthermore, the driven or drive electrodes are defined as being made up of outer most driven-X-bars 203 and intermediate X bars or resistive-X-bars 205 connected using resistive elements 206 in a chain 210. The outer most X bars are referred to as driven-X-bars 203. However, it will be appreciated that all of the X-bars might be driven X-bars without using resistive elements.

Typical resistive elements 206 have resistive values ranging from a few KΩ up to high 10's of KΩ. Lower values require more current (and hence energy) to drive from the control chip but allow faster capacitive measurements as they have lower time constants and hence can be charged and discharged faster. Higher values require less current (and hence energy) to drive but have higher time constants and hence must be charged and discharged more slowly. Larger values also help to make any resistance build up in interconnecting wiring contribute a smaller voltage drop to the emitted field strength from the X bars, and hence make for a more efficient system. For this reason, generally higher values are preferred.

Another key reason to include the resistive-X-bars is that it makes the segment scalable, i.e. by adding more resistive-X-bars the segment can be made larger. This is at the expense of spatial resolution; the segment uses the same two driven-X-bars and hence the resolution of the measurement must be fundamentally the same, but the segment is now spread across a larger region and so spatially the resolution degrades. Making the segment scalable means that fewer driven-X-bars are needed and hence fewer connections to the control chip. By balancing the trade-off between spatial resolution and connection cost/complexity an optimal solution may be found for each design.

Overall, the bars in Layer 1 can be seen to be substantially area filling; almost all of the surface area is flooded with electrode. The gaps between the bars 205 can be made arbitrarily small and indeed, the smaller the better from a visibility point of view. Making the gaps larger than around 100 µm is non-ideal as this leads to increased visibility of the gap to the human eye and a key goal is often to try and make an invisible touch screen. A larger gap also tends to increase the possibility of a significant fringing electric field near the gap to electrodes in Layer 2 which will lead to worsening non-linearity. Gaps of a few 10's of micrometers are common as they are almost invisible and can be easily mass-produced, for example gaps of between 20 and 50 micrometers.

Figure 4:
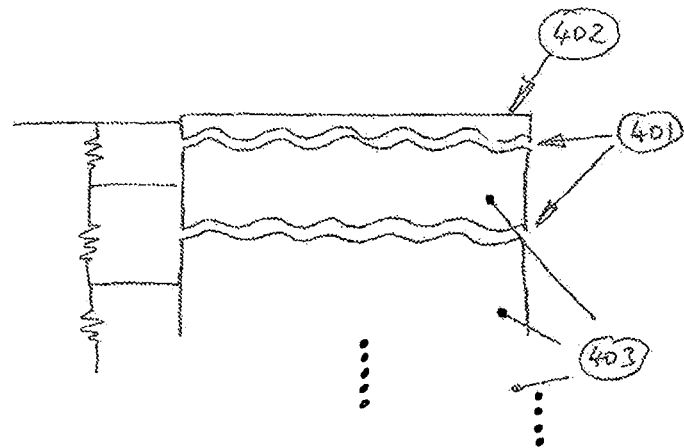
FIG. 4 shows a portion of the electrode pattern of drive electrodes according to an embodiment of the invention.

FIG. 4 shows a portion of the electrode pattern of drive electrodes according to an embodiment of the invention. Referring to FIG. 4, it is also desirable to use a gap with a small up/down wave pattern 401 between driven 402 and resistive-X-bars 403 as this helps to disguise the gap when viewed through Layer 2 with the added effect of the parallax caused by the substrate thickness. Various patterns can be used to help disguise the gap when viewed in this way, for example a sine wave, triangle wave or square wave could be used. The frequency and amplitude are chosen to help break up the otherwise long linear gap when viewed through the complex but regular pattern in Layer 2. The amplitude must be minimized to avoid errors in the reported touch coordinate.

Figure 5A:
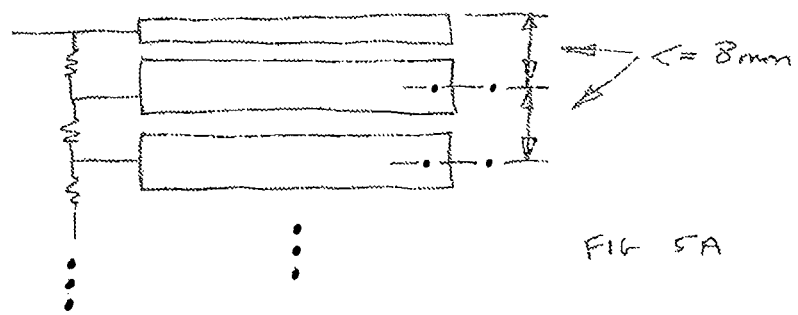
FIG. 5A shows a portion of the electrode pattern shown in FIG. 2A.

FIG. 5A shows a portion of the electrode pattern shown in FIG. 2A.

Figure 5B:
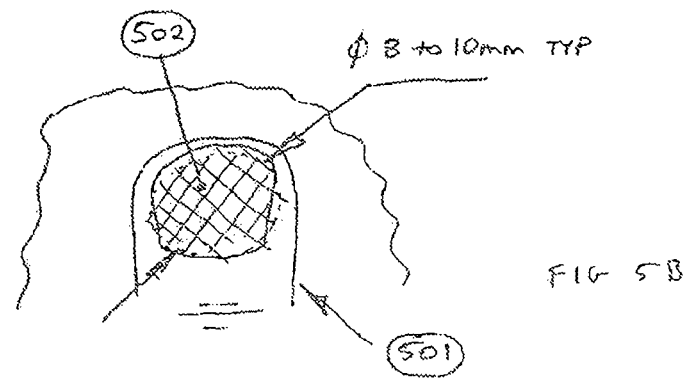
FIG. 5B shows a typical finger tip.

FIG. 5B shows a typical finger tip.

The electrode bars (both types) are generally designed so that they have a fundamental pitch of around 8 mm or less, as shown in FIG. 5A preferably 5 mm. This is in recognition that, as shown in FIG. 5B, a typical finger touch 501 creates a generally circular region 502 (illustrated in FIG. 5B with hashing) of around 8 to 10 mm in diameter and so matching the electrode pitch to the touch size optimizes the interpolating effect of the touch. Making the pitch of the electrodes larger than 8 mm can start to lead to distinct non-linearity in the response as the interpolation is well below ideal. In essence, by making the electrode bars too wide, as the touching finger moves perpendicular to the bars its influence tends to "saturate" over one electrode before it starts to interact with the next electrode to any significant degree. When the pitch is optimized, the finger will cause a steadily reducing influence on one bar while already starting to create a well balanced increase on the neighboring bar, with the peak influence being spatially quite distinct i.e. steady increase immediately followed by steady decrease with no appreciable transition distance from increase to decrease (or vice-versa).

Figure 6:
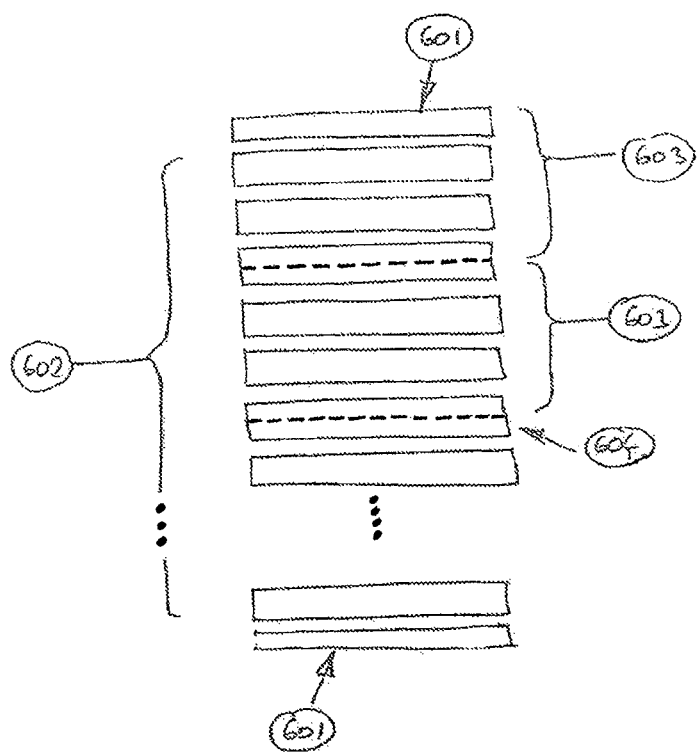
FIG. 6 shows an electrode pattern of drive electrodes according to an embodiment of the invention.

FIG. 6 shows an electrode pattern of drive electrodes according to an embodiment of the invention. Referring to FIG. 6 the driven-X-bars at the outer edges of Layer 1 601 are made to be half the width of all other bars 602. The overall design is in essence several identical concatenated segments 603, and the driven-X-bars on the inside of the layer 604 are also half width but are butted up to the neighboring segment with its half width outer bar, so driven-X-bars internal to the pattern appear to be full width. FIG. 6 shows the virtual division of the internal bars 604 with a dashed line; in practice of course the bars 604 are one-piece. Having the pattern at its outer two edges with half-width bars improves the overall linearity; if the pattern were infinite then the linearity would be perfect in this regard, but of course the pattern must end and hence there is a natural non-linearity at the edges.

Figure 7A:
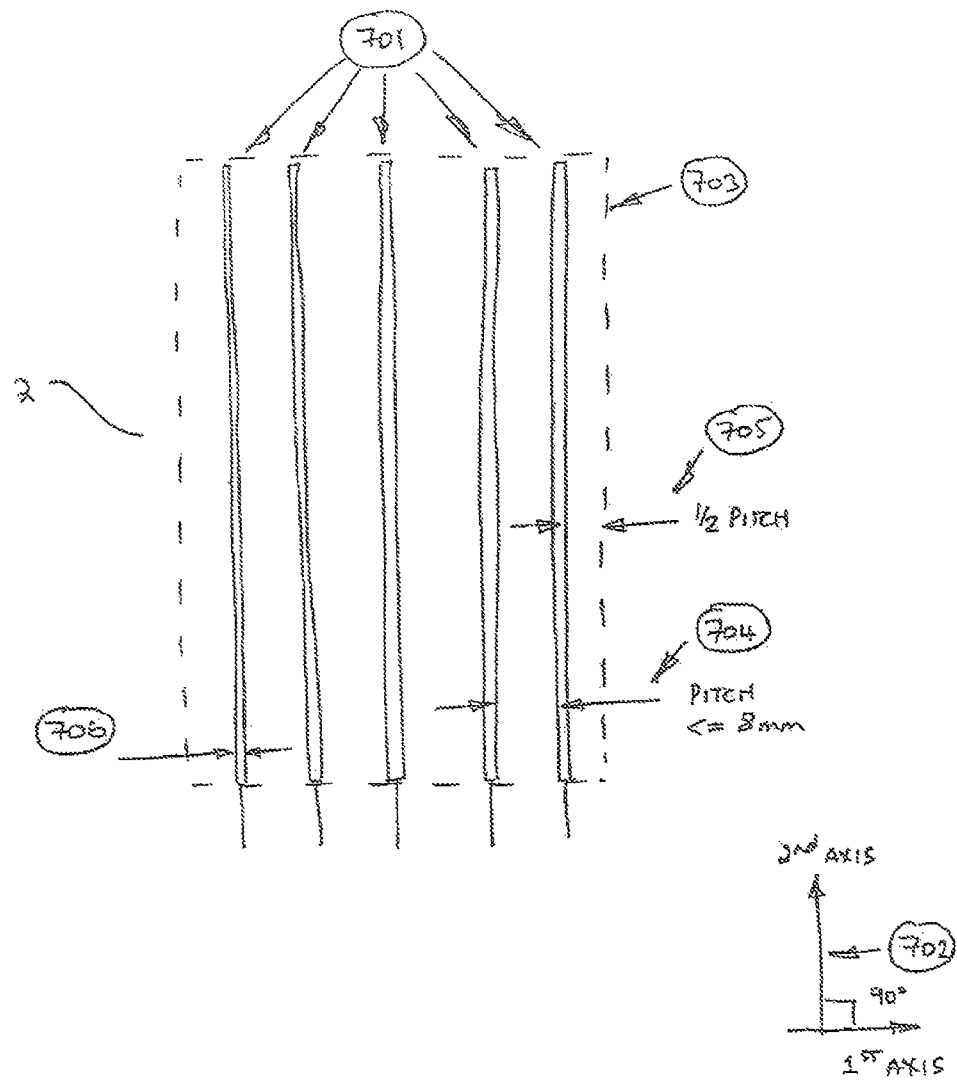
FIG. 7A shows an electrode pattern of sense electrodes according to an embodiment of the invention.

FIG. 7A shows an electrode pattern of sense electrodes according to an embodiment of the invention. Layer 2 is the layer nearest to the touch surface. Referring to FIG. 7A in its simplest form, the electrodes on Layer 2 are a uniformly spaced series of narrow lines running along a second axis at nominally 90 degrees to the first axis used in Layer 1 herein referred to as an x direction. That is to say that the Layer 1 or drive electrodes cross the Layer 2 or sense electrodes. The electrodes on Layer 2 are referred to as sense electrodes, y-electrodes, Y lines or receive electrodes. They are arranged to lie directly and completely over the area 703 occupied by the X bars underneath. The spacing between the bars has a similar influence on the linearity as does the spacing of the X bars. This means that the Y lines need to be spaced with a pitch of 8 mm or less 704, preferably 5 mm for best intrinsic linearity. In a similar way to the Layer 1 with its half-width outer X bars, the gap from the edge of the Layer 2 pattern to the first line is half of this pitch 705 to improve the linearity. The width of the Y lines 706 is important. They need to be narrow enough so that they are not easily visible to the human eye, but wide enough that they have a resistance (at their "far-end") that is low enough to be compatible with capacitive measurements. Narrower is also better as far as noise immunity is concerned because the surface area of the Y line has a direct influence of on how much electrical noise can be coupled into the Y lines by a finger touch. Having narrower Y lines also means that the capacitive coupling between the X and Y layer is minimized, which, as previously mentioned, helps to maximize signal-to-noise ratio.

Figure 7B:
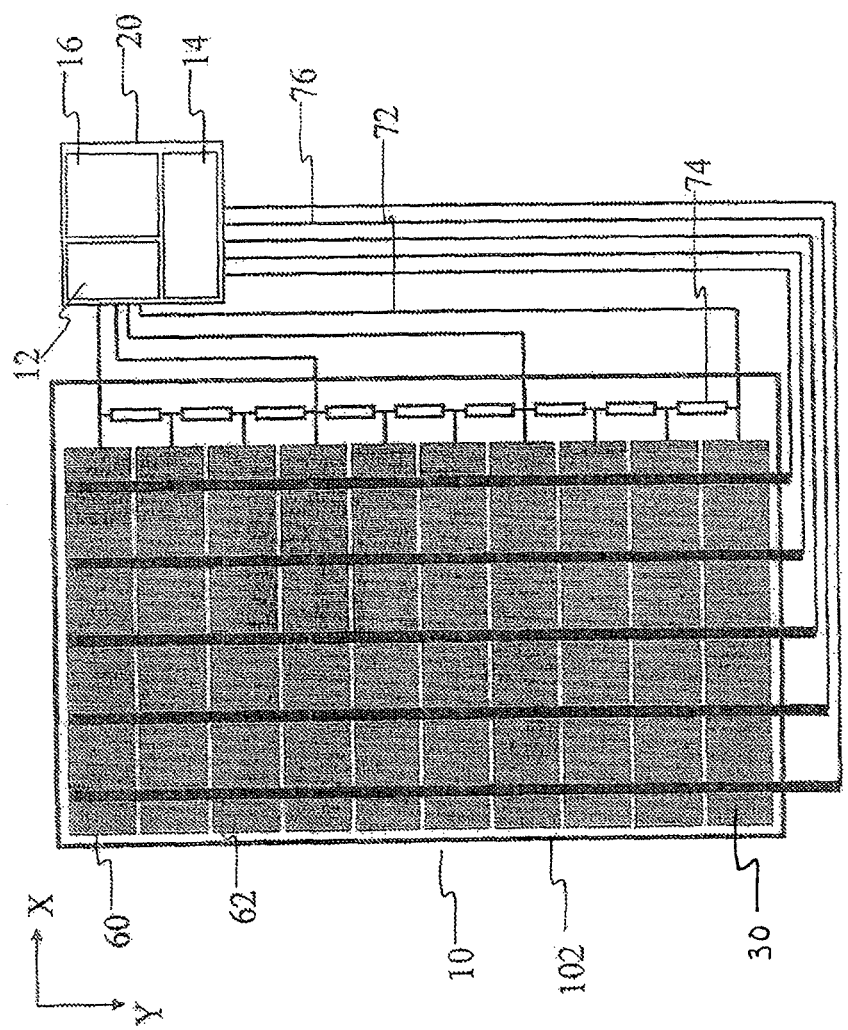
FIG. 7B shows a two-electrode layer capacitive touch screen according to an embodiment of the present invention with drive and sense units connected via channels to a controller.

FIG. 7B shows a touch sensor 10 according to an embodiment of the invention. The sensor 10 shown in the figure combines the electrode patterns from FIG. 2A and FIG. 7A. The sensor 10 comprises a substrate 102 bearing an electrode pattern 30 defining a sensitive area or sensing region of the sensor and a controller 20. The controller 20 is coupled to electrodes within the electrode pattern by a series of electrical connections which will be described below. The electrode pattern 30 is made up of Layer 1 electrodes and Layer 2 electrodes on opposing sides of the substrate 102 as shown in FIG. 1B.

Referring to FIG. 7B, the controller 20 provides the functionality of a drive unit 12 for supplying drive signals to portions of the electrode pattern 30, a sense unit 14 for sensing signals from other portions of the electrode pattern 30, and a processing unit 16 for calculating a position based on the different sense signals seen for drive signals applied to different portions of the electrode pattern. The controller 20 thus controls the operation of the drive and sense units, and the processing of responses from the sense unit 14 in the processing unit 16, in order to determine the position of an object, e.g. a finger or stylus, adjacent the sensor 10. The drive unit 12, sense unit 14 and processing unit 16 are shown schematically in FIG. 7B as separate elements within the controller. However, in general the functionality of all these elements will be provided by a single integrated circuit chip, for example a suitably programmed general purpose microprocessor, or field programmable gate array, or an application specific integrated circuit, especially in a microcontroller format.

In the figure there is provided a number of drive electrodes 60 represented by longitudinal bars extending in the x-direction as described above and shown in FIG. 2A. On the opposing surface of the substrate 102, there is provided a number of sense electrodes 62 forming electrode Layer 2 as shown in FIG. 7A and described above that cross the drive electrodes 60 of Layer 1 in the y-direction.

The sense electrodes are then connected to the sense unit 14 via connections or tracks 76 and the drive electrodes are connected to the drive unit 12 via connections or tracks 72. The connections to the drive and sense electrodes are shown schematically in FIG. 7B. However, it will be appreciated that other techniques for routing the connections or tracks might be used. All of the tracks might be routed to a single connector block at the periphery of the substrate 102 for connection to the controller 20.

The operation of the sensor 10 shown in FIG. 7B is described below. As can be seen there are conflicting requirements for the Y lines in terms of their width. The strongest requirement tends to be the minimization of the resistance of the Y line to ensure successful capacitive measurement within an acceptable overall measurement time. This leads to wider electrodes, typically in the region of 100 µm to 1000 µm. Where the visibility of the electrodes is either not an issue or where the electrodes can be made practically invisible (such as index matched ITO on PET for example), then the compromises are all quite easily accommodated and the width increase is a simple choice. But where the visibility is an issue and the method used to fabricate the electrodes cannot be made sufficiently invisible (such as non index matched ITO on glass) then some alternative arrangement must be found. In this case, a method called in-filling can be used as now described and illustrated.

FIG. 8A shows a portion of the electrode pattern shown in FIG. 7A with infilling electrodes. This method fills all "unused" 801 space with isolated squares of conductor 802 (ITO for example), separated with gaps 803 to its neighbors that are small enough to be practically invisible and small enough to cause significant square-to-square capacitance. Another key factor in designing the isolated elements or islands is to make them the same size 804 in each axis as the width of the Y lines 805. In this way, the uniformity of the overall pattern is optimal, and the only irregularity is in the length of the Y lines. This pattern is substantially invisible to the human eye. The gaps between neighboring squares, and the gaps between squares and neighboring Y lines can be made arbitrarily small, typically in the region of 10's of µm as they are almost invisible and can be easily mass-produced. The in-filling is generated during manufacture at the same time, and using the same process steps, as the sense electrodes, so they are made of the same material and have the same thickness and electrical properties as the sense electrodes. This is convenient, but not essential. The in-filling could be carried out separately in principle.

The isolated squares 802 serve to obscure the overall pattern but they also act as a capacitive interpolator (somewhat analogous to the resistive interpolator used in Layer 1). The capacitive interpolator so formed has the effect of only minimally impacting the fringing fields between the Y line and the underlying X bars. This is important because the field must spread out down to the X bars sufficiently from the edges of the Y lines to allow a substantial touch influence over at least half the pitch of the Y lines. This holds true so long as the capacitance from square to square is substantially higher (at least ×2) the capacitance of a square down to the X bars. The reason for this is that under these conditions the electric field tends to propagate from square to square more easily than it is shunted down to the X layer. As a result, the field distributions of a design with no in-fill compared to one with in-fill are similar enough that the linearity is preserved. If the square-to-square gaps are increased, the linearity degrades because the field tends to pass via the first couple of squares away from a Y line down to the X bars and so does not propagate far from the Y line.

FIG. 8B illustrates these capacitive paths between example infilling electrodes and between an example infilling electrode and an example X electrode. Capacitance from square 808 to square 808 is shown with nominal capacitors 806 and capacitance from one of the squares 808 down to an adjacent X bar 809 is shown with nominal capacitor 807.

It should be noted that the in-fill is not actually needed in this design, but it can be used to minimize pattern visibility without compromising the linearity of the output.

In operation the transmitting or drive electrodes are sequenced such that only one driven-X-bar 203 is ever active at one time, all others being driven to a zero potential. The field emitted therefore only radiates from one segment at a time. This radiated field couples locally into all of the Y lines 701 above the segment in question. The control chip then takes a capacitive measurement for each of the "intersections" or "crossings" formed between the X and the Y electrodes in this segment. Each XY intersection is also known as a node. In sequence, each driven-X-bar is activated, holding all others at zero potential. In this way, each segment is sequentially scanned. Once all segments have been completed, a total of N×M nodes will have been measured where N is the number of driven-X-bars and M is the number of Y lines. It should be stressed that the node measurements are all independent of each other making it possible to detect several touch locations simultaneously. Another important point in the way the XY array is scanned is that because only one segment is active at any one time, the others being driven to zero potential, only touches in the active segment can influence the measured node capacitances in that segment (at least to a first approximation). This means that an effect known as "hand-shadow" is strongly minimized. Hand-shadow is an effect caused by the proximate location of the palm, thumb, wrist etc to the touch screen when the user touches with a finger.

Figure 9:
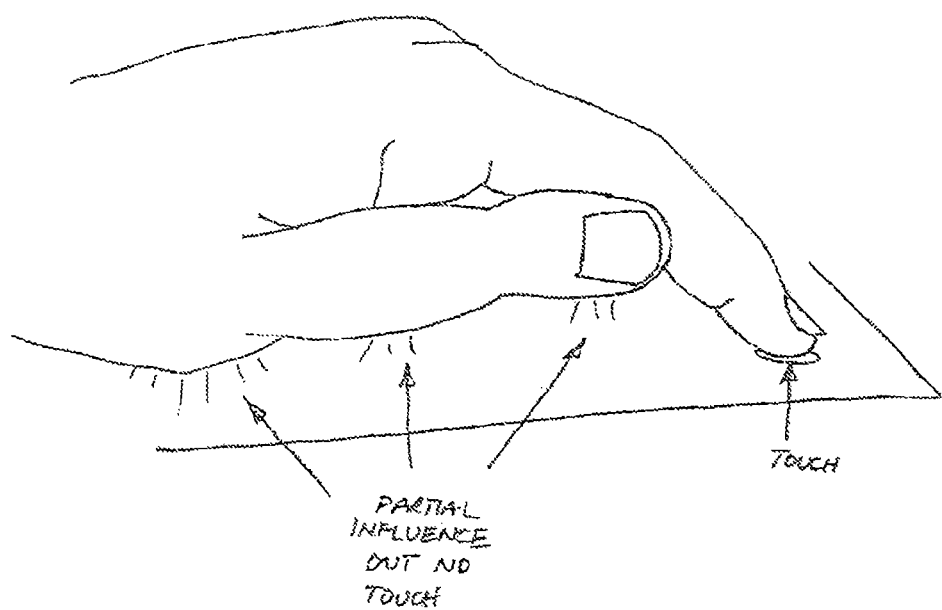
FIG. 9 shows hand-shadow caused by a proximate location of the palm, thumb, wrist etc to a touch screen when the user touches with a finger.

FIG. 9 shows hand-shadow caused by a proximate location of the palm, thumb, wrist etc to a touch screen when the user touches with a finger. The nature of capacitive measurement means that the electric fields tend to radiate or project from the surface of the device and so can be influenced even by objects that are not in direct contact with the surface. This influence would normally serve to distort the reported touch location, as the combined capacitive readings of the finger together with readings caused by the "hand shadow" would slightly corrupt the computed coordinates reported by the control chip. By activating only one segment at a time this normally problematic effect is drastically reduced.

Having scanned the entire touch screen, generating N×M node measurements, it is a simple task to compute the touch location, in both of the axes, of one or more objects, as described in U.S. patent application 60/949,376 published as WO 2009/007704 [5] on 15 Jan. 2009, using a combination of logical processing to discover the node at the approximate centre of each touch, and standard mathematical centroid computations of the relative signal strengths around each touch detected. The touch location along the first axis is resolved using the touch's centre node signal and the immediately adjacent node signal to each side that lie along the first axis. Likewise, the location in the second axis is resolved using the centre node and the immediately adjacent node signals that lie along the second axis.

A key design advantage in having the entire Layer 1 almost entirely covered or flooded with emitting X electrodes is that because these electrodes are virtually immune to changes in parasitic capacitive loading (they are relatively low impedance drivers, even the resistively coupled X bars still only have DC resistances of a few 10's of KΩ and so can charge and discharge any moderate parasitics very quickly) any change in the distance between the rear (non-touch side) of Layer 1 and a nearby ground load will make no difference to the measured capacitances of the nodes. The touch screen is thus touch-sensitive only on one side, Layer 2. This has major benefits when slightly flexible front panels are used that can bend relative to an LCD placed below the touch screen. The separation between Layer 1 and Layer 2 is fixed by the substrate material and hence the capacitance between these two is fixed even if the substrate is bent during touch causing the rear of Layer 1 to experience a change in its ambient conditions.

A further advantage to using the flooded X design is that it provides an inherent amount of noise attenuation for radiated emissions that are present behind Layer 1. This is common with LCD modules that tend to have large amplitude drive signals present on their outer layers. These drive waveforms will normally couple to the Y lines and disturb the momentary reported capacitance of the associated nodes. However, because the Y lines are effectively shielded by the flooded X layer, the only remaining mechanism for the noise to couple to the Y lines is capacitively via the X layer itself. The X bars, as already described, are reasonably low resistance and so can only be disturbed by the interfering noise waveform in proportion to the ratio of the impedance of the noise coupling vs. the impedance of the X bar. Hence, the amount of noise coupled onward to the Y lines is attenuated by this ratio. The coupling of the noise waveform to X bars is purely capacitive and so decreasing this coupling capacitance helps to attenuate the interference even more. This can be achieved by arranging an air gap between the LCD and the back of Layer 1, or by using a transparent dielectric spacer layer instead of the air gap that will yield a higher capacitance of coupling but has the advantage of being mechanically robust. In a traditional capacitive touch screen an entire extra "shielding" layer below Layer 1 must often be used to mitigate this LCD noise. This layer is often driven to zero potential or is actively driven with a facsimile of the capacitive acquisition waveform, which serves to isolate the noise from the capacitive nodes. This has the disadvantage of adding cost and complexity, worsens optical properties and also tends to attenuate the size of the change in capacitance during touch (leading to lower resolution and worse signal-to-noise ratio). The flooded X design described herein will often produce sufficient inherent attenuation of the coupled noise that no extra layer is required, offering a substantial commercial advantage.

Another advantage found with this design is that the Y lines can be made narrow in comparison to the size of the touching object. In particular, the Y lines can have a width of one quarter or less than the size of the touching object, or equivalently the pitch of the X electrodes. For example, a Y line width of 0.5 mm is 16 times narrower than the width of a typical finger touch. The implication of this is related to the surface area available for interaction with the touching finger. A narrow Y line has a very small surface area to couple capacitively to the touch object; in the example cited, the coupled area is around 4 mm$^2$ compared with the total "circular" touch area of around 50 mm$^2$. With such a small area coupled to the touch, the amount of noise injected into the Y line from the finger is minimized because the coupling capacitance is small. This has an attenuating effect on any differential noise between the touch object and device using the touch screen. Furthermore, by making narrow Y lines the resistance is reduced. Reducing the resistance of the Y lines reduces the acquisition times and decreases the power dissipation.

In summary, the advantages of the described touch screen are:
1. Only two layers are required for construction leading to; (i) improved optical transmission (ii) thinner overall construction (iii) lower cost.
2. Area filling design for electrodes on Layer 1 leading to; (i) almost invisible electrode pattern when using ITO (ii) isolation of the Y lines on Layer 2 from capacitive effects below Layer 1 (iii) partial attenuation of noise coupled from an underlying LCD module or other noise source.
3. Narrow Y lines on Layer 2 with optional area filling isolated squares leading to; (i) almost invisible electrode pattern when using ITO (ii) reduced electrode area reduces susceptibility to coupling noise from touch.

It is also desirable to minimize the number of Y lines used across Axis 1—labeled the first axis in FIG. 7A. This generally leads to a lower cost control chip and simplifies interconnection of the electrodes. With the described Y line design, the fundamental pitch between lines needs to be 8 mm or below to achieve good linearity. Spacing the lines further apart rapidly compromises linearity in Axis 1. To enable the Y lines to have a greater "reach" the following adaptation can be made to the Layer 2 design.

Figure 10:
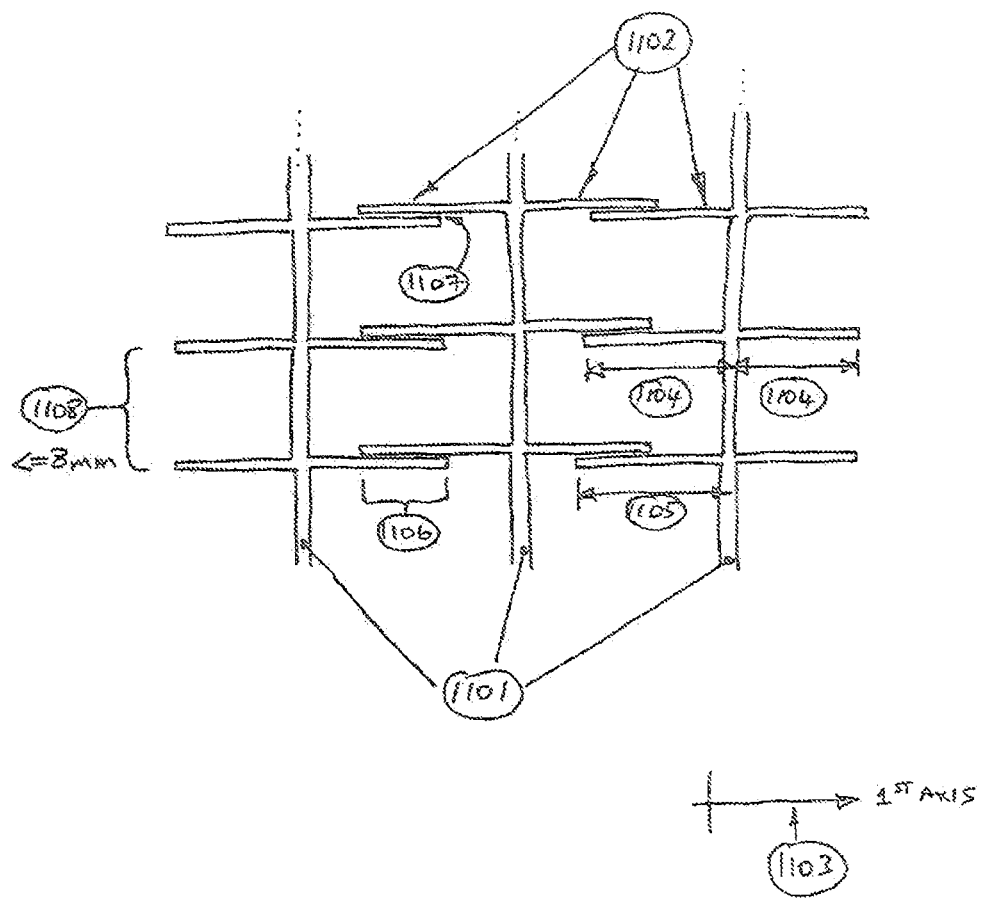
FIG. 10 shows a portion of an electrode arrangement of sense electrodes.

FIG. 10 shows a portion of an electrode arrangement of sense electrodes which modifies the Y line 1101 design to add a series of cross-members 1102 running along the first axis 1103 and equally disposed 1104 so as to be centered about the Y line. The cross members span approximately ½ to ¾ of the gap to the next Y line 1105 in both directions. The cross members on each successive Y line are arranged so that they overlap the cross members of those on the neighboring Y lines 1106 with the gap 1107 between the overlapping sections chosen to be a few 10's of μm to minimize visibility and prevent any substantial fringing fields from forming along the inside of the overlapped region. The cross members are spaced by a distance 1108 along the Y line on a pitch of 8 mm or less, and ideally they are spaced to lie with a uniform relationship to the gaps in the underlying X bars. This ensures that the field patterns are uniform and symmetrical in all regions of the touch screen, leading to good linearity. The cross members effectively act to spread the electric field further beyond the primary Y line and the overlapped region helps to gradate the field from one Y region to the next in a linear fashion.

Embodiments of the invention shown in FIGS. 2A, 7A, 7B and 10 may further comprise connections to both extents of the drive and sense electrodes or transmitting electrodes and Y lines respectively. That is to say that a connection is made at both ends of each of the drive and sense electrodes. This may increase the linearity of the electric filed along the drive electrodes and improve the shielding of the flooded electrode design.

Embodiments of the invention may also be applied to non-display applications, for example touch pads on a laptop or control panels on domestic appliances.

Figure 11:
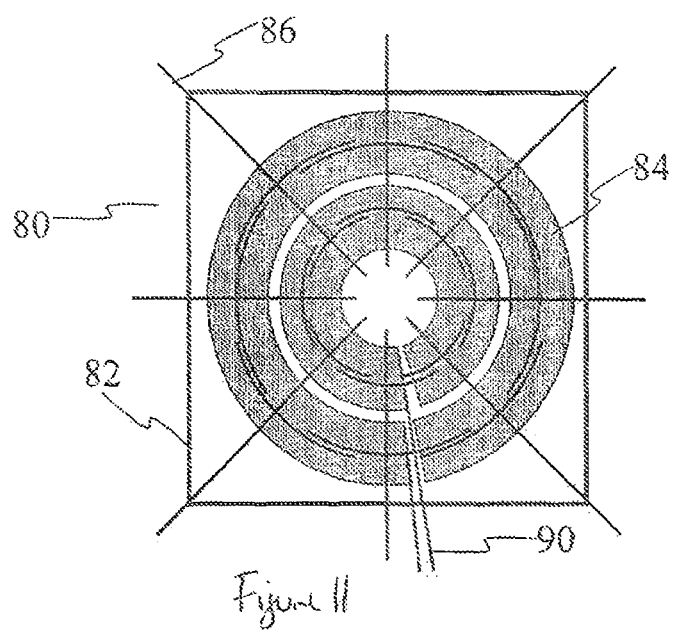
FIG. 11 shows a two-electrode layer capacitive touch screen according to another embodiment of the present invention.

FIG. 11 shows a sensor 80 comprising an electrode pattern according to an embodiment of the invention. For simplicity the electrode pattern shown in the figure does not include any circuitry. However, it will be appreciated that drive and sense circuitry may also be used as described above for the FIG. 7B embodiment. The figure shows an electrode pattern on opposing sides of a substrate 82, viewed from above to show the relative position of the electrode patterns.

The electrode pattern comprises two annular electrodes of the type described above referred to as Layer 1 or transmit electrodes. The transmit electrodes may also be referred to as drive electrodes. The drive electrodes shown in the figure are effectively the transmit electrodes shown in FIG. 2A and have been wrapped around arcuately to form a complete, or near complete, ring or annulus, as might be used by a scroll wheel sensor for example. Connected to each of the drive electrodes is a connection or track to provide a drive signal from an appropriate drive unit (not shown). The drive unit described above may be used. The electrode pattern further comprises a number of sense electrodes referred to above as Layer 2 electrodes 86 which extend radially from a central point. The Layer 2 electrodes may also be referred to as sense electrodes or receive electrodes. The sense electrodes 86 are in the form shown in FIG. 10 and described above. The sense electrodes are connected to a sense unit (not shown) via connections or tracks (not shown). The operation of the sensor 80 is similar to that described above. However, the readout from a processing unit (not shown) connected to the drive and sense units will be different. The output of the processing unit will provide a polar coordinate of an object adjacent the sensor 80. The annular sensor 80 may be used in an application where two circular controls are typically used in combination, for example the bass and treble controls or the left/right and front/rear fade controls on a hi-fi amplifier. It will be appreciated that further annular shaped drive electrodes may be implemented in the sensor 80 shown in the figure. This embodiment may therefore be summarized as following a polar coordinate grid, with the two electrode types extending radially and arcuately, in contrast to the other embodiments which follow a Cartesian coordinate grid, with the two electrode types extending along the x- and y-axes.

In a modification of the FIG. 11 design, the arcuate path may extend over a smaller angle for example a quarter or half circle instead of a full circle, or another angular range.

FIG. 12 is a view of a front side of a position sensor 10 according to an embodiment of the invention which follows the design of FIG. 10. The front side of the position sensor is typically the side facing the user during normal use of the sensor or an apparatus incorporating the sensor. The sensor 10 comprises a substrate 40 bearing an electrode pattern 30 defining a sensitive area or sensing region of the sensor and a controller 20. The controller 20 is coupled to electrodes within the electrode pattern by a series of electrical connections which will be described below. The electrode pattern 30 is on opposing sides of a substrate, as described below.

The electrode pattern 30 on the substrate 40 can be provided using conventional techniques (e.g. lithography, deposition, or etch or deactivation techniques). The substrate is of a dielectric material such as a plastics film, in this case Polyethylene Terephthalate (PET). The electrodes comprising the electrode pattern are of a transparent conductive material, in this case Indium Tin Oxide (ITO). Alternatively, the electrodes could be formed from an opaque conductive material such as metal e.g. copper. The substrate may be bonded to an overlying panel (not shown) using a suitable pressure sensitive adhesive (PSA) which can be clear to allow light transmission. Thus the sensitive area of the sensor as a whole is transparent. If transparent, the sensor layer may be used over an underlying display without obscuration. In other embodiments, if the sensor layer is opaque, it may comprise a conventional printed circuit board or other substrate with a copper electrode pattern, e.g. for use in a mobile telephone keypad.

Figure 13A:
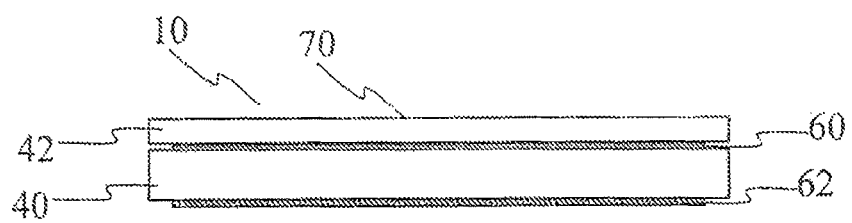
FIG. 13A shows a side on view the position sensor array according to an embodiment of the invention.

FIG. 13A shows the preferred arrangement of the sensor 10 from a side on view. The figure illustrates how electrodes 60 are disposed on one surface of the substrate 40 and electrodes 62 are disposed on the opposing surface of the substrate 40. The electrodes 60, 62 are sense and drive electrodes respectively, i.e. the drive electrodes are typically place farthest away from the touch surface. To isolate the sensor from an object adjacent the sensor an insulating dielectric layer 42 is also disposed overlying the sensor. The insulting layer 42 could be a glass or plastics panel. The sensor is used to detect the position of an object adjacent the sensor on the front side 70.

Figure 13B:
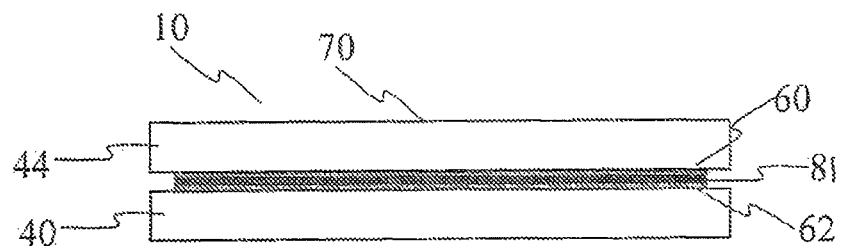
FIG. 13B shows a side on view the position sensor array according to an embodiment of the invention.

FIG. 13B shows an alternative arrangement of the sensor 10 from a side on view. The figure illustrates how the electrodes 60 are disposed on one surface of a substrate 40 and the electrodes 62 are disposed on a different substrate 44. The two substrates 42, 44 are then brought together as shown in the figure. An insulating layer 81 is typically disposed between the two sets of electrodes to prevent an electrical contact between the two set of electrodes. Alternatively, both sets of electrodes could be coated with an insulating layer.

Figure 13C:
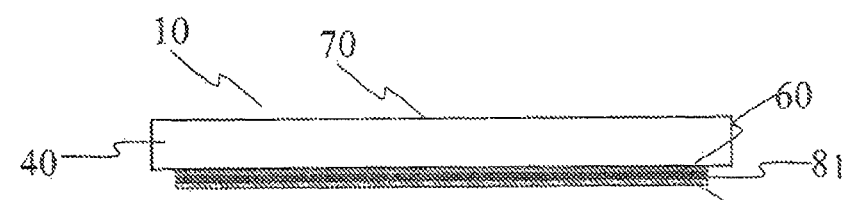
FIG. 13C shows a side on view the position sensor array according to an embodiment of the invention.

FIG. 13C shows an alternative arrangement of the sensor 10 from a side on view. The figure illustrates how the electrodes 60 are disposed on one surface of a substrate 40. The electrodes 62 are disposed on the electrodes 60, separated from an insulating layer 81 disposed between the two electrodes patterns 60, 62. Other arrangements are envisaged such that the electrode patterns are electrically isolated from one another and the electrodes are separated from objects adjacent the sensor by a suitable dielectric material.

Referring to FIG. 12, the controller 20 provides the functionality of a drive unit 12 for supplying drive signals to portions of the electrode pattern 30, a sense unit 14 for sensing signals from other portions of the electrode pattern 30, and a processing unit 16 for calculating a position based on the different sense signals seen for drive signals applied to different portions of the electrode pattern. The controller 20 thus controls the operation of the drive and sense units, and the processing of responses from the sense unit 14 in the processing unit 16, in order to determine the position of an object, e.g. a finger or stylus, adjacent the sensor 10. The drive unit 12, sense unit 14 and processing unit 16 are shown schematically in FIG. 12 as separate elements within the controller. However, in general the functionality of all these elements will be provided by a single integrated circuit chip, for example a suitably programmed general purpose microprocessor, or field programmable gate array, or an application specific integrated circuit.

In the figure there is provided a number of sense electrodes 62 made up of two elements, herein referred to as spines 64 and branches 66. The spines 64 of the sense electrodes extend in the y-direction, also referred to as the y direction or a longitudinal direction. The branches 66 extend in the x-direction or an x direction crossing the spine 64. The branches 66 extend both left and right from the spines 64, i.e. in both the negative and positive x-direction in respect of the figure. Negative and positive x-direction are also referred to as the x direction and a −x direction respectively, wherein the −x direction opposes the x direction. The extent or length of the branches is approximately ¾ of the spacing between adjacent sense electrode spines 64. The branches 66 from adjacent sense electrodes 62 coextend or are coextensive. That is to say that the branches 66 from adjacent sense electrode spines 64 occupy the same portion of the sensing region. The extent of the coextension of the branches 66 shown in FIG. 12 is approximately Y2 of the spacing between adjacent sense electrode spines 64. It will be appreciated that the extent of the branches 66 could be varied as could the extent of the coextension. The spacing between the coextensive sense electrode branches is typically around ten micrometers or a few tens of micrometers, for example between 5 μm and 50 μm, most preferably between 10 μm and 30 μm. The spacing will be chosen to provide an adequate screening effect while being easy to reliably fabricate and also invisible to the naked eye of a user.

On the opposing surface of the substrate 40 underlying the sense electrodes, as described above there is provided a number drive electrodes 60 represented by longitudinal bars extending in an x-direction also referred to as the x direction or latitudinal direction. That is to say that the drive electrodes extend along an axis in the x-direction. The drive electrodes 60 are shaded in the figure, but it will be appreciated that these will be constructed from a solid material layer. The drive electrodes 60 are spaced apart by typically around ten micrometers or a few tens of micrometers, for example between 5 μm and 50 μm, most preferably between 10 μm and 30 μm. The spacing will be chosen to provide an adequate screening effect while being easy to reliably fabricate and also invisible to the naked eye of a user.

For a device designed to be actuated by finger touches, the width of the drive electrodes 60 in the y-direction or the y direction (also referred to as the longitudinal direction), are typically in the range 4-10 mm, for example 4 mm, 5 mm, 6 mm, 7 mm, 8 mm, 9 mm or 10 mm. The width of the drive electrodes is determined by the size of the object that will be used on the surface of the sensor 10. For example, if the sensor 10 is designed to detect the position of a finger adjacent the sensor 10, the width of the drive electrodes 10 will be greater than if the sensor 10 is designed to detect the position of a stylus. The area of the substrate that is covered by the drive electrodes 60 is may be referred to as the sensing area, the sensing region or the sensitive area.

The drive electrodes shown in FIG. 12 effectively cover or flood the surface of the substrate with an electrode layer. However, it will be appreciated that the drive electrodes may also be constructed with a smaller width than that shown in the figure and described above, such that the each of the drive electrodes 60 covers an area of the sense region that is similar to that covered by the sense electrodes. That is to say that the drive electrodes might have a width of less than 5 mm and spacing in the y-direction of greater than 30 μm.

The sense electrode branches overlying the drive electrodes are typically symmetrically disposed over the associated drive electrodes, for example centrally disposed in y between the edges of the associated drive electrodes. That is to say that the upper and lower edge of a pair of coextensive sense electrode branches is equidistant from the upper and lower edge of the underlying drive electrode. Upper and lower edges are used to describe the uppermost extent and lowermost extent of a drive electrode in the y-direction.

The drive and sense electrodes shown in FIG. 12 may be considered to form a number of discrete sensing areas, nodes or keys. Referring to the uppermost drive electrode there are seven discrete keys as shown by the dotted regions 68. The different discrete regions are defined by the number of exposed edges of the sense electrodes that are present.

It is known that in mutual- or active-type sensing, the majority of the field lines occur at the edges of the electrodes. Referring to the upper-left discrete key, there is a portion of the branch electrode from the leftmost sense electrode spine having two edges, namely an upper and lower edge in the y-direction in the orientation shown. The next discrete region to the right only has one exposed edge from the leftmost sense electrode spine, i.e. the upper edge of the branch electrode. This is because the coextension of the branch from an adjacent electrode spine effectively shields the lower edge of this branch. In the next discrete key region to the right there are no exposed edges from the leftmost sense electrode. A similar scenario exists for the second sense electrode spine. However, as can be seen in the figure this spine will have two exposed edges at the electrode spine and one exposed edge to the left and to the right of the electrode spine. The branches spread the electric field between adjacent sense electrode spines.

To reduce the number of drive lines used to drive the drive electrodes 60, the drive electrodes 60 are coupled via drive channels 72 to the controller drive unit 12. Each drive channel supplies drive signals to a group of three drive electrodes. That is to say that although four drive electrodes are connected together, the lower drive electrode will be connected to ground. The drive electrodes 60 are each connected to each other by a chain or row of resistors 70. Alternatively, a single resistive strip could be used (not shown in figure). When operated each of the grouped drive electrodes will receive a different value drive signal. For example, the drive electrode that is connected directly to the drive unit 12 will receive the applied signal value, the drive electrode below will receive two thirds of the applied signal value and the drive electrode below that will receive a third of the applied signal value. In this example the fourth drive electrode connected directly to a drive channel will be connected to ground. However, this drive electrode will be driven using the full signal value when the next group of electrodes is driven. It will be appreciated that if there are fewer drive electrodes or there is no restriction on the number of connections to the drive unit, the drive electrodes could all be driven using separate drive channels. Alternatively, if more drive electrodes are required this can be achieved without introducing more drive channels by connecting adjacent drive electrodes to each other in groups with resistors and only directly addressing every second, third, fourth etc. drive electrode.

The sense electrodes are then connected to the sense unit 14 via connections or tracks 76 and the drive electrodes are connected to the drive unit 12 via connections or tracks 72. The connections to the drive and sense electrodes are shown schematically in FIG. 12. However, it will be appreciated that other techniques for routing the connections or tracks might be used. All of the tracks might be routed to a single connector block at the periphery of the substrate 40 for connection to the controller 20.

The x position of the touch or other actuation is obtained by ratiometric interpolation of the signal strength of adjacent sense electrodes in the x-direction with the highest signal. In FIG. 12 four electrodes would be used to interpolate a touch in the x-direction. Once the full set of sense signals is collected from driving the drive electrodes the two adjacent x-electrodes that yielded the strongest signals are selected, and the x-position determined by ratiometric interpolation of the signal strength of these two signals.

The y position of the touch or other actuation is also obtained by ratiometric interpolation of the signal strength. Once the full set of sense signals are collected from driving the drive electrodes, the two y-electrodes that yielded the strongest signals are selected, and the y position determined by ratiometric interpolation of the signal strength of these two signals.

Alternative interpolation methods may incorporate weighting factors, for example one of the known adjacent key suppression algorithms which suppress or give lower weighting to signals from some keys, for example based on proximity to a key deemed to be a current touch location, or expected hand shadow effects, as is known in the art. Interpolation need not be done in a row-wise and columnwise manner as described above. For example, interpolation could be among all nearest neighbor keys, or all keys in a sub-block region previously defined. Many other variations of interpolation methods will be envisaged.

Figure 14A:
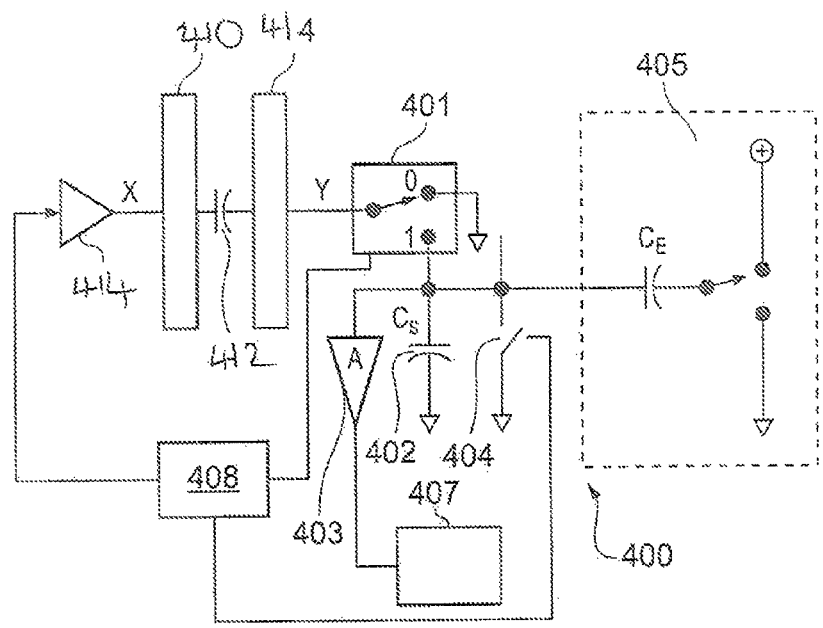
FIG. 14A schematically shows a circuit which may be used to measure the charge transferred from a driven one of the drive electrodes to the sense electrodes.
Figure 14B:
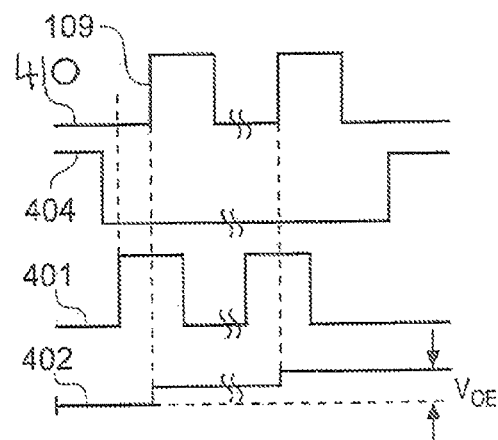
FIG. 14B shows schematically the timing relationships of operation of the circuit of FIG. 14A.

FIG. 14A schematically shows a circuit which may be used to measure the charge transferred from a driven one of the drive electrodes to the sense electrodes, the drive electrode being driven at a given time and the sense electrode have a self capacitance. This is determined primarily by their geometries, particularly in the regions where they are at their closest. Thus the driven drive electrode is schematically shown as a first plate 410 of a capacitor 412 and the sense electrode is schematically shown as a second plate 414 of the capacitor 412. Circuitry of the type shown in FIG. 14B is more fully described in WO 00/44018 [1]. The circuit is based in part on the charge-transfer ("QT") apparatus and methods disclosed in U.S. Pat. No. 5,730,165 [3], the contents of which are incorporated herein by reference. It will be appreciated that the arrangement of drive electrodes shown in FIG. 12 are grouped together. In this case the group of drive electrodes is considered to be the driven electrode schematically shown as the first plate 410. As described above one of the drive connections of a group of drive electrodes is connected to a signal and the other drive connection is connected to ground.

During operation the groups of drive electrodes are sequentially driven, while the sense electrodes are all sensed simultaneously. Alternatively, the sense electrodes could also be sequentially sensed, using either many sense units or a single sense unit connected to all the sense electrodes using appropriate multiplexing.

The drive channel associated with the presently driven electrode 410, the sense channel associated with sense electrode 414 and elements of the sensor controller are shown as combined processing circuitry 400 in FIG. 14A. The processing circuitry 400 comprises a sampling switch 401, a charge integrator 402 (shown here as a simple capacitor), an amplifier 403 and a reset switch 404, and may also comprise optional charge cancellation means 405.

FIG. 14B shows schematically the timing relationships between the driven electrode drive signal from the drive channel 414 and the sample timing of switch 401. The drive channel 414 and the sampling switch 401 are provided with a suitable synchronizing means, which may be a microprocessor or other digital controller 408, to maintain this relationship. In the implementation shown, the reset switch 404 is initially closed in order to reset the charge integrator 402 to a known initial state (e.g., zero volts). The reset switch 404 is then opened, and at some time thereafter the sampling switch 401 is connected to charge integrator 402 via terminal 1 of the switch for an interval during which the drive channel 414 emits a positive transition, and thereafter reconnects to terminal 0, which is an electrical ground or other suitable reference potential. The drive channel 414 then returns to ground, and the process repeats again for a total of 'n' cycles, (where n may be 1 (i.e. 0 repeats), 2 (1 repeat), 3 (2 repeats) and so on). It can be helpful if the drive signal does not return to ground before the charge integrator is disconnected from the sense electrode since otherwise an equal and opposite charge would flow into/out of the sense channel during positive and negative going edges, thus leading to no net transfer of charge into the charge detector. Following the desired number of cycles, the sampling switch 401 is held at position 0 while the voltage on the charge integrator 402 is measured by a measurement means 407, which may comprise an amplifier, ADC or other circuitry as may be appropriate to the application at hand. After the measurement is taken, the reset switch 404 is closed again, and the cycle is restarted, though with the next drive channel and driven electrode in sequence replacing the drive channel 414 and driven electrode 100 schematically shown in FIG. 14A. The process of making a measurement for a given driven electrode is referred to here as being a measurement 'burst' of length 'n' where 'n' can range from 1 to any finite number. The circuit's sensitivity is directly related to 'n' and inversely to the value of the charge integrator 402.

It will be understood that the circuit element designated as 402 provides a charge integration function that may also be accomplished by other means, and that this type of circuit is not limited to the use of a ground-referenced capacitor as shown by 402. It should also be self-evident that the charge integrator 402 can be an operational amplifier based integrator to integrate the charge flowing through in the sense circuitry. Such integrators also use capacitors to store the charge. It may be noted that although integrators add circuit complexity they provide a more ideal summing-junction load for the sense currents and more dynamic range. If a slow speed integrator is employed, it may be necessary to use a separate capacitor in the position of 402 to temporarily store the charge at high speed until the integrator can absorb it in due time, but the value of such a capacitor becomes relatively non-critical compared to the value of the integration capacitor incorporated into the operational amplifier based integrator.

It can be helpful for the sampling switch 401 to connect the sense electrode of the sensor to ground when not connected to the charge integrator 402 during the changes of drive signal of the chosen polarity (in this case positive going). This is because this can create an artificial ground plane, thus reducing RF emissions, and also, as noted above, permitting the coupled charge of opposite polarity to that being sensed by the charge integrator 402 to properly dissipate and neutralize. It is also possible to use a resistor to ground on the sense electrode to accomplish the same effect between transitions of drive channels 414. As an alternative to a single-pole double-throw (SPDT) switch 401, two independent switches can be used if timed in an appropriate manner.

As described in U.S. Pat. No. 5,730,165 [3], there are many signal processing options possible for the manipulation and determination of a detection or measurement of signal amplitude. U.S. Pat. No. 5,730,165 [3] also describes the gain relationship of the arrangement depicted in FIG. 12, albeit in terms of a single electrode system. The gain relationship in the present case is the same. The utility of a signal cancellation means 405 is described in U.S. Pat. No. 4,879,461 [4], as well as in U.S. Pat. No. 5,730,165 [3]. The disclosure of U.S. Pat. No. 4,879,461 [4] is herein incorporated by reference. The purpose of signal cancellation is to reduce the voltage (i.e. charge) build-up on the charge integrator 402 concurrently with the generation of each burst (positive going transition of the drive channel), so as to permit a higher coupling between the driven electrodes and the receiving sense electrodes. One benefit of this approach is to allow a large sensing area that is sensitive to small deviations in coupling between the electrodes at relatively low cost. Such large sense couplings are present in physically relatively large electrodes such as might be used in human touch sensing pads. Charge cancellation permits measurement of the amount of coupling with greater linearity, because linearity is dependent on the ability of the coupled charge from the driven electrode 100 to the sense electrode 104 to be sunk into a 'virtual ground' node over the course of a burst. If the voltage on the charge integrator 402 were allowed to rise appreciably during the course of a burst, the voltage would rise in inverse exponential fashion. This exponential component has a deleterious effect on linearity and hence on available dynamic range.

The drive channel may be a simple CMOS logic gate powered from a conventionally regulated supply and controlled by the sensor controller 20 to provide a periodic plurality of voltage pulses of a selected duration (or in a simple implementation a single transition from low-to-high or high-to-low voltage, i.e. a burst of one pulse). Alternatively, the drive channel may comprise a sinusoidal generator or generator of a cyclical voltage having another suitable waveform. A changing electric field is thus generated on the rising and failing edges of the train of voltage cycles applied to the driven electrode. The driven electrode and the sense electrode are assumed to act as opposing plates of a capacitor having a capacitance $C_E$. Because the sense electrode is capacitively coupled to the driven electrode, it receives or sinks the changing electric field generated by the driven column electrode.

This results in a current flow in the sense electrode induced by the changing voltage on the driven electrode through capacitive differentiation of the changing electric fields. The current will flow towards (or from, depending on polarity) the sense channels in the sense unit 14. As noted above, the sense channel may comprise a charge measurement circuit configured to measure the flow of charge into/out of (depending on polarity) the sense channel caused by the currents induced in the sense electrode.

The capacitive differentiation occurs through the equation governing current flow through a capacitor, namely:

$$I_E = C_E \times \frac{dV}{dt}$$

where $I_E$ is the instantaneous current flowing to a sense channel and dV/dt is the rate of change of voltage applies to a driven electrode. The amount of charge coupled to the sense electrode (and so into/out of the sense channel) during an edge transition is the integral of the above equation over time, i.e.

$$Q_E = C_E \times V.$$

The charge coupled on each transition, $Q_E$, is independent of the rise time of V (i.e. dV/dt) and depends only on the voltage swing at the driven electrode (which may readily be fixed) and the magnitude of the coupling capacitance $C_E$ between the driven electrode and sense electrode. Thus a determination of the charge coupled into/out of charge detector comprising the sense channel in response to changes in the drive signal applied to the driven electrode is a measure of the coupling capacitance $C_E$ between the driven electrode and the sense electrode.

The capacitance of a conventional parallel plate capacitor is almost independent of the electrical properties of the region outside of the space between the plates (at least for plates that are large in extent compared to their separation). However, for a capacitor comprising neighboring electrodes in a plane this is not the case. This is because at least some of the electric fields connecting between the driven electrode and the sense electrode "spill" out from the substrate. This means the capacitive coupling (i.e. the magnitude of $C_E$) between the driven electrode and the sense electrode is to some extent sensitive to the electrical properties of the region in the vicinity of the electrodes in to which the "spilled" electric field extends.

In the absence of any adjacent objects, the magnitude of $C_E$ is determined primarily by the geometry of the electrodes, and the thickness and dielectric constant of the sensor substrate. However, if an object is present in the region into which the electric field spills outside of the substrate, the electric field in this region may be modified by the electrical properties of the object. This causes the capacitive coupling between the electrodes to change, and thus the measured charge coupled into/from the charge detector comprising the sense channel(s) changes. For example, if a user places a finger in the region of space occupied by some of the of the spilled electric fields, the capacitive coupling of charge between the electrodes will be reduced because the user will have a substantial capacitance to ground (or other nearby structures whose path will complete to the ground reference potential of the circuitry controlling the sense elements). This reduced coupling occurs because the spilled electric field which is normally coupled between the driven electrode and sense electrode is in part diverted away from the electrode to earth. This is because the object adjacent the sensor acts to shunt electric fields away from the direct coupling between the electrodes.

Thus by monitoring the amount of charge coupled between the driven electrode and the sense electrode, changes in the amount of charge coupled between them can be identified and used to determine if an object is adjacent the sensor (i.e. whether the electrical properties of the region into which the spilled electric fields extend have changed).

Figure 15A:
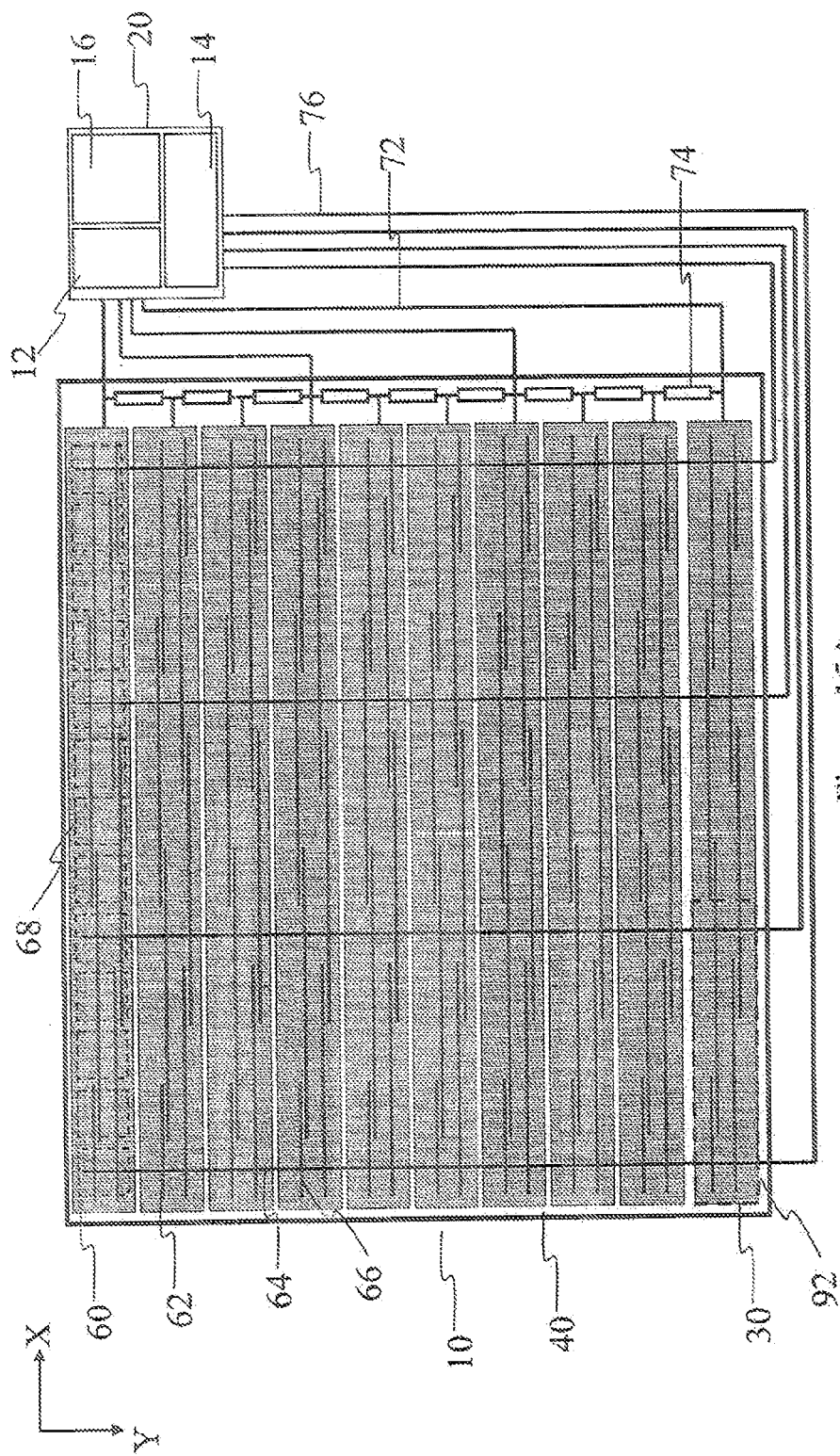
FIG. 15A shows a position sensor array according to another embodiment of the invention.
Figure 16:
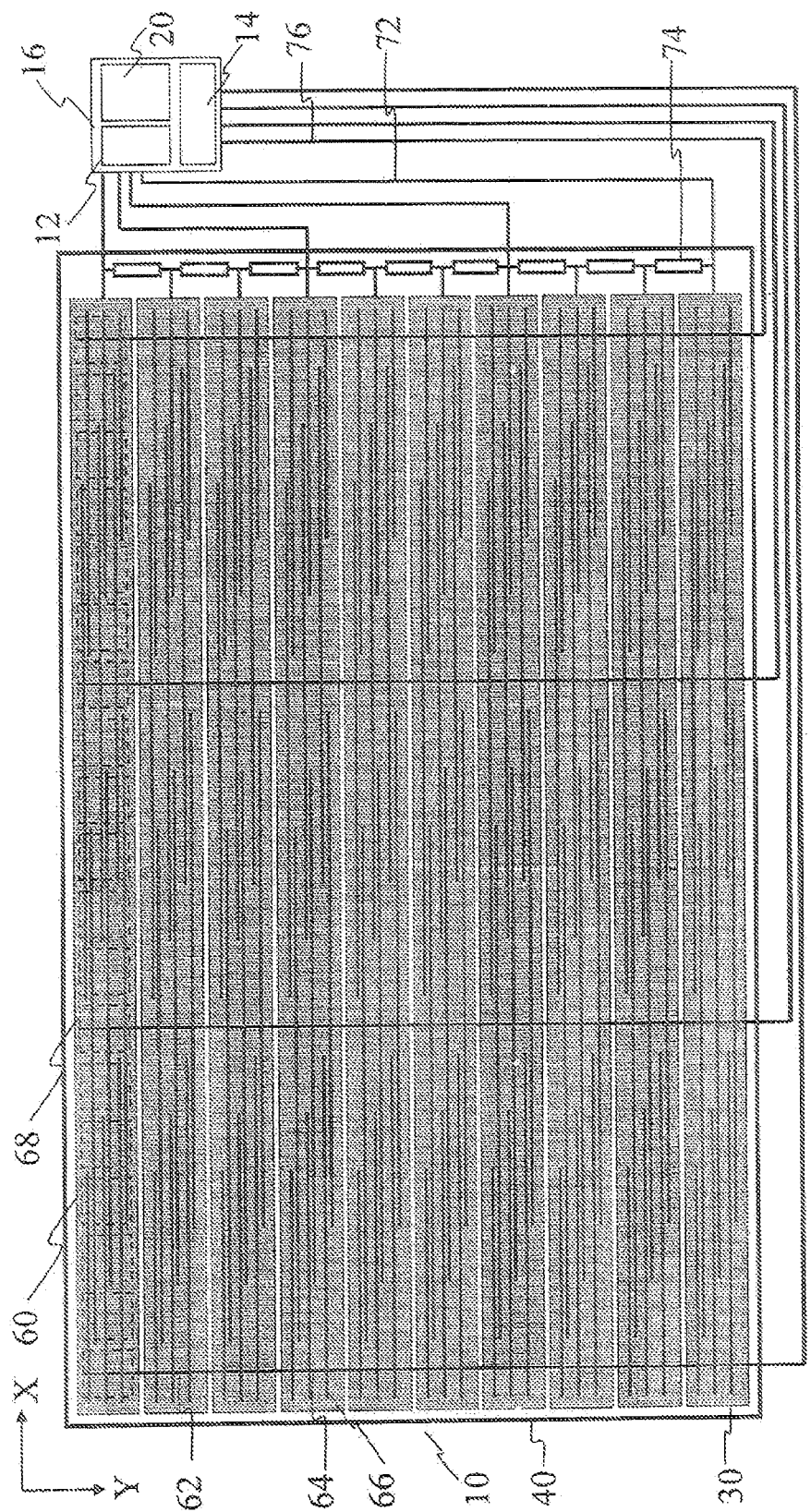
FIG. 16 shows a position sensor array according to another embodiment of the invention.
Figure 17:
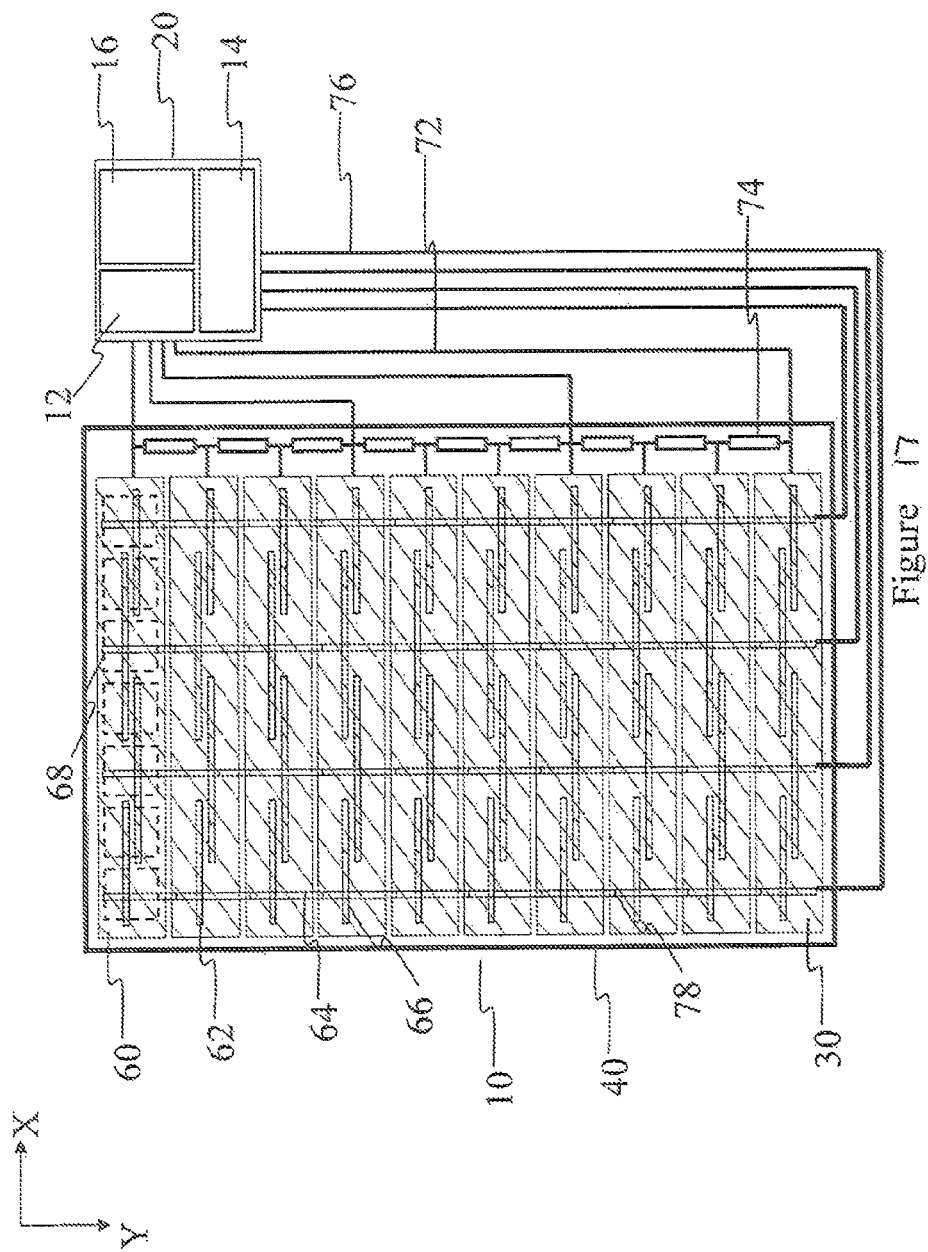
FIG. 17 shows a position sensor array according to another embodiment of the invention.

FIG. 15A, FIG. 16 and FIG. 17 show further electrode patterns embodying the invention which can be applied to a substrate incorporated in a capacitive position sensor. The electrode patterns of these further embodiments are extensions of the y-interpolation approach taken by the pattern of FIG. 12 in which multiple branches of each sense electrode are provided for each drive electrode. The same reference numerals are used to denote corresponding features where appropriate.

FIG. 15A is a view of a front side of a position sensor 10 according to another embodiment of the invention. The position sensor shown in FIG. 15A is similar to the sensor shown in FIG. 12 in layout and operation except the number of branches 66 that extend from the sense electrode pine 64 is different. In the sensor shown in the figure there are two branches that extend from the spine 64 at each drive electrode 60 location. The length of the two branches is different and the coextension is also offset from one another at the location of each drive electrode 60. This is done to alter the number of exposed edges of the branches of the sense electrodes. The two individual branches of each of the two sets of branches extend ⅜'ths and ⅞'ths of the way from their own spine to the adjacent sense electrode spine 64 to provide an overlap of ⅞+⅜−1=⅛=¼ of the spine separation distance. As can be seen in the figure there are four sense electrode spines 64 and thus four sense channels 76 (same as FIG. 12), but the number of discrete sensing elements or regions 68 is thirteen (compared with 7 in FIG. 12).

Figure 15B:
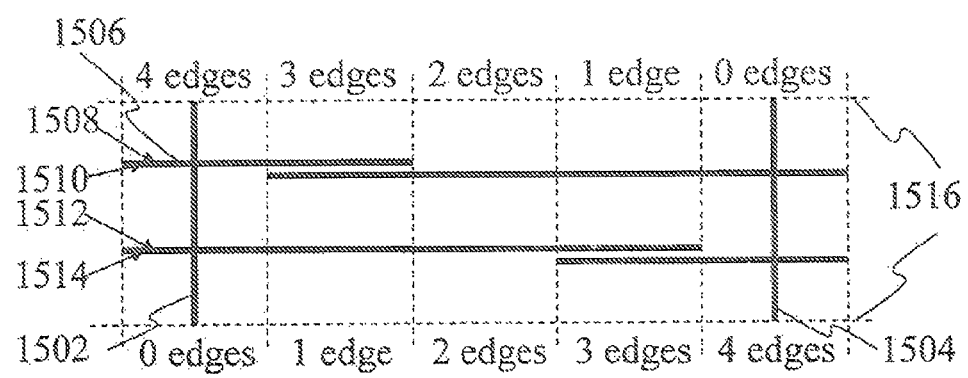
FIG. 15B shows an expanded portion of the position sensor shown in FIG. 15A, showing the number of exposed branch edges.

FIG. 15B shows an area 92 of the position sensor 10 shown in FIG. 15A as an expanded view. The expanded view of FIG. 15B shows two adjacent spines 1502, 1504. There are four branches 1506 extending from the spines, two from each spine 1502, 1504. The exposed edges are the edges of the branches that are not adjacent another branch electrode. For example, at the left spine shown in the figure there are 4 exposed edges 1508, 1510, 1512, 1514. The number of exposed branch edges for the left electrode spine 1502 shown in the figure is 4 at the left, and decrements by 1 for each discrete sensing element or region defined by a dotted square in the figure. At the adjacent spine 1504 on the right, there are no exposed edges from the left spine 1502. The number of exposed edges of the left spine 1502 at each region is marked on FIG. 15B along the upper edge of the expanded area. Similarly the number of exposed branch edges of the right spine 1504 at each region is marked on FIG. 15B along the lower edge of the expanded area. The extent or boundary of the flooded x-electrode in the y-direction is shown in the Figure by two horizontal dotted lines 1516.

FIG. 16 is a view of a front side of a position sensor 10 according to another embodiment of the invention. The position sensor shown in FIG. 15 is similar to the sensor shown in FIG. 12 in layout and operation except the number of branches 66 that extend from the sense electrode spine 64 is increased. In the sensor shown in the figure there are three branches that extend from the spine 64 at each drive electrode 60 location. The length of the three branches is different and the coextension region is also offset from one another at each drive electrode 60 location. This is done to alter the number of exposed edges of the branches. The three branches in the figure that extend in the x direction or right from the sensor spines extend to $7/12$, $9/12$ and $11/12$ respectively of the spacing between adjacent sense electrode spines 64. The three branches that extend in the −x direction or left from the sensor spines extend $11/12$, $9/12$ and $7/12$ respectively of the spacing between adjacent sense electrode spines 64. As can be clearly seen from the figure there are still only four sense electrode spines 64 and thus four sense channels 76, but the number of discrete sensing elements 68 has increased from 7 in FIGS. 12 to 20. Referring to FIG. 16, the number of exposed branch edges starting from the left-most electrode spine 64 is 6, and decrements by 1 for each discrete sensing element 68 down to zero at the adjacent sensor electrode spine.

Figure 18:
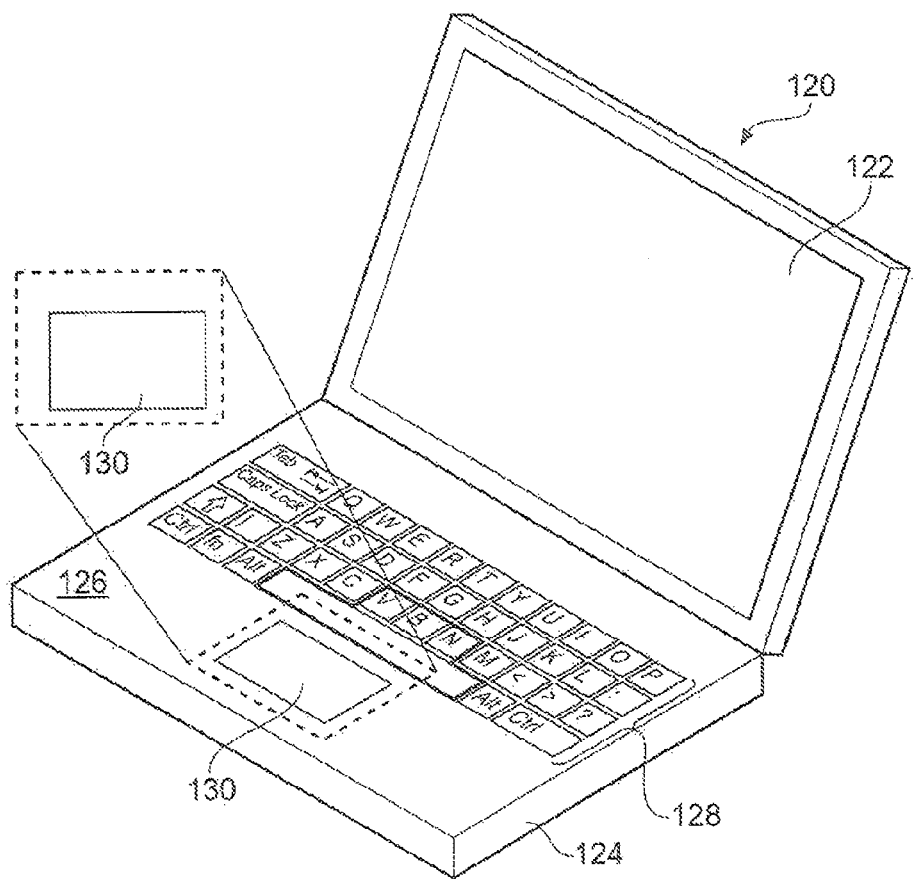
FIG. 18 schematically shows a portable personal computer incorporating a sensor according to an embodiment of the invention.

FIG. 17 is a view of a front side of a position sensor 10 according to another embodiment of the invention. The position sensor shown in FIG. 18 is similar to the sensor shown in FIG. 12 in layout and operation. However, the position sensor shown in the figure has an alternative arrangement of electrodes. The drive and sense electrodes shown in the figure are made up of thin wires or a mesh of wire instead of the continuous layer of electrode material shown in FIG. 12. The drive electrodes 60 are constructed by a rectangular perimeter of wire to define the shape of the drive electrode with a series of diagonal wire lines going across the rectangular perimeter. The diagonal lines are typically at an angle of 45 degrees to an axis running along the x-direction. The diagonal lines and the rectangular perimeter of each drive electrode are electrically connected and connected to the drive unit 12 via the drive channels 72. The wires or mesh are manufactured from metal wires e.g. copper, but could also be made of gold or silver. Similarly the sense electrodes are also manufactured using a thin metal trace that follows the perimeter of the sense electrode pattern shown in FIG. 12. The sense electrodes 62 are relative narrow compared to the drive electrodes 60, so there is no need to use in-filling with diagonal lines. However, some extra wires are added within the sense electrode mesh structure as shown in FIG. 17 by short lines 78. This is to add redundancy in the pattern, so that if there is a defect in the electrode wire at one location, the current has an alternative path. Such defects can occur if there is a defect in the optical mask used to pattern the wires or if there is debris on the surface of the wires during processing. It will be appreciated that the electrode arrangements shown in FIG. 16 and FIG. 17 may also be constructed from the electrode wires or mesh as described above.

It will be understood that the "mesh" or "filligrane" approach to forming each electrode out of a plurality of interconnected fine lines of highly conducting wire or traces may be used for either Layer 1 (X drive), Layer 2 (Y sense) or both. The FIG. 17 embodiment uses meshes for both layers. However, a particularly preferred combination for display applications or other applications where invisibility is important is that Layer 1 is made with non-mesh, i.e. "solid" electrodes with the small, invisible gaps, for example from ITO, and Layer 2 is made with mesh electrodes, for example out of copper, having line widths sufficiently small to be invisible also.

It will be appreciate that the patterns shown in FIG. 12, FIG. 15, FIG. 16 and FIG. 17 can be repeated or extended in both the x- and y-direction.

The sensors shown in FIG. 12, FIG. 15, FIG. 16 and FIG. 17 allow the width (x-direction) of a 2DCT to be increased without increasing the number of sense channels, while retaining the same resolution and using a linear interpolation technique. This is clearly shown in FIG. 12, FIG. 15 and FIG. 16 which although schematic and not to scale in an absolute sense are drawn to the same scale as each other to illustrate how the total width of the 2DCT can be increased by increasing the number of y-interpolation branches per drive "cell" without changing the number of sense channels which is four in all the illustrated examples.

The number of sense channels can vary. Moreover, the number of sense channel branches per drive cell can be greater than illustrated above. The above embodiments show 1, 2 and 3 branches per drive cell, but the number could be 4, 5, 6 or more in principle, although there is likely to be a practical limit that arises from usual design trade-offs between numbers of channels, read-out time and complexity of the electrode patterns.

The role of the branches is therefore to linearize the transition from one sense channel to the next.

Generally the number of "keys" 'K' will be a function of the number of sense channels 'n' and the number of sense branches per drive electrode cell 'm' given by the formula $K=2m(n-1)+1$. Tabulated for values of 'm' up to 4 and 'n' up to five, this gives the following numbers of keys:

|       | n = 2 | n = 3 | n = 4 | n = 5 |
|-------|-------|-------|-------|-------|
| m = 1 | 3     | 5     | 7     | 9     |
| m = 2 | 5     | 9     | 13    | 17    |
| m = 3 | 7     | 13    | 19    | 25    |
| m = 4 | 9     | 17    | 25    | 33    |

It will also be understood that the drive electrode spacing will preferably have comparable dimension to the touch size of the touching object for which the sensor is designed. On the other hand, through the use of the y-interpolation feature of the sense electrode branches, the sense electrode spacing can be sparser. With only one set of sense electrode branches per drive electrode (FIG. 12), the sense electrode spacing will generally be twice the drive electrode spacing assuming the key dimensions in x- and y- are set the same. With two sets of sense electrode branches per drive electrode (FIG. 15), the sense electrode spacing will generally be four times the drive electrode spacing. With three sets of sense electrode branches per drive electrode (FIG. 16), the sense electrode spacing will generally be six times the drive electrode spacing. That is to say, the sense electrode spacing will in general be '2m' times the drive electrode spacing assuming the key dimensions in x and y are set the same. Normally the key dimensions in x and y if not the same will be similar, so the sense electrode spacing will usually be within '2m±1' times the drive electrode spacing. Further, if the touching object for which the sensor is designed is a human finger, then each key will typically have x- and y-dimensions in the range 5-10 mm.

In the above, it will be understood that reference to 'per drive electrode' relates to individual drive electrodes regardless of whether the drive electrodes are directly addressed or not. For example, in the embodiment of FIG. 12, there are 10 drive electrodes, but only 4 drive channels as a result of use of bridging resistors 74.

It will be appreciated that the sensor of the invention is applicable to many types of device/appliance. For example, sensors can be used with ovens, grills, washing machines, tumble-dryers, dish-washers, microwave ovens, food blenders, bread makers, drinks machines, computers, home audiovisual equipment, personal computers, portable media players, PDAs, cell phones, computers, games consoles and so forth.

FIG. 18 shows an example of a mobile personal computer (PC) 120. A touch sensor according to the present technique could be used to form part or the whole of an input control panel of the notebook PC 120. In the figure, the PC 120 is shown, which includes a display device 122 attached to a base 124, which accommodates a processor and other components typically associated with a PC. An input control panel 126 includes a keyboard 128. The input control panel 126 further includes a touch sensitive mouse pad 130. The mouse pad can be implemented using a touch sensor according to the present invention. Moreover, the display device 122 can also be implemented with a touch sensor according to the present invention overlaid on top of it to provide a touch screen. This may be particularly useful for a tablet PC.

Figure 19:
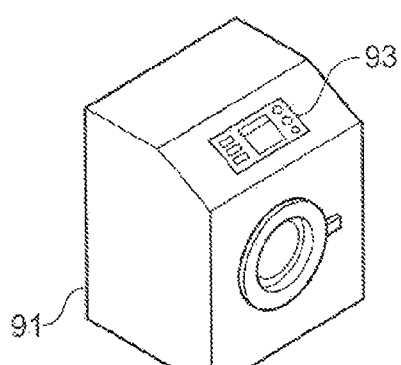
FIG. 19 schematically shows a washing machine incorporating a sensor according to an embodiment of the invention.

FIG. 19 schematically shows a washing machine 91 incorporating a control panel 93 which incorporates a sensor according to the invention.

Figure 20:
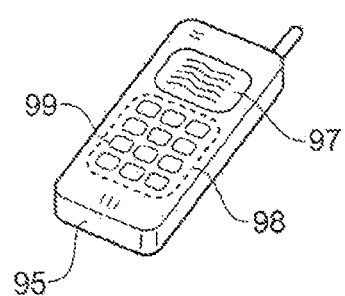
FIG. 20 schematically shows a cellular telephone incorporating a sensor according to an embodiment of the invention.
Figure 21:
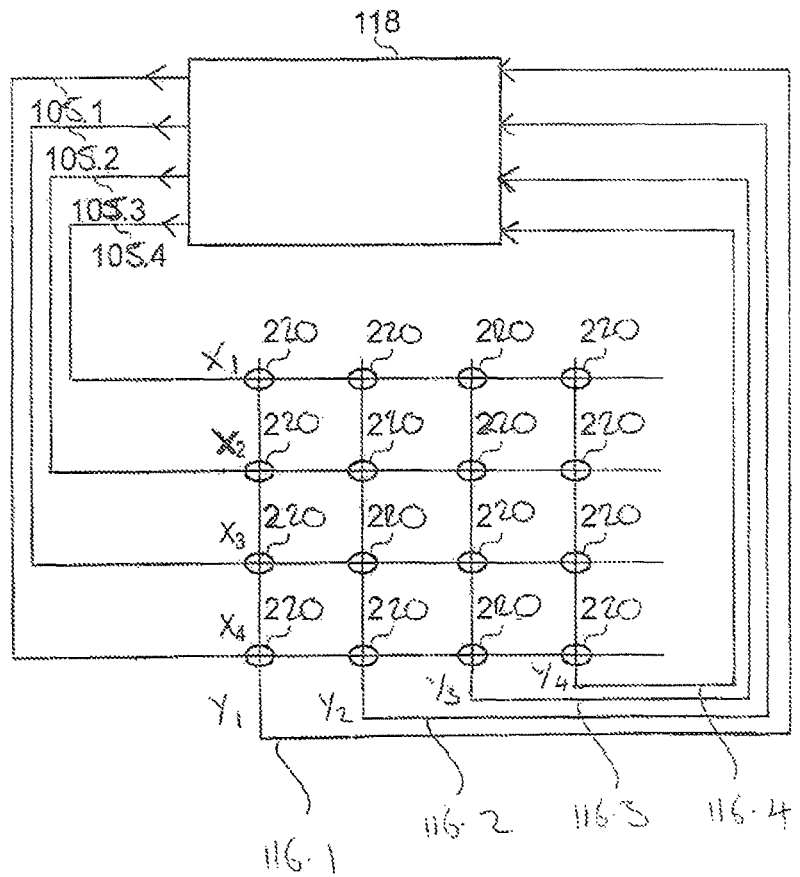
FIG. 21 illustrates schematically a representative portion of a prior art position sensor.
Figure 22:
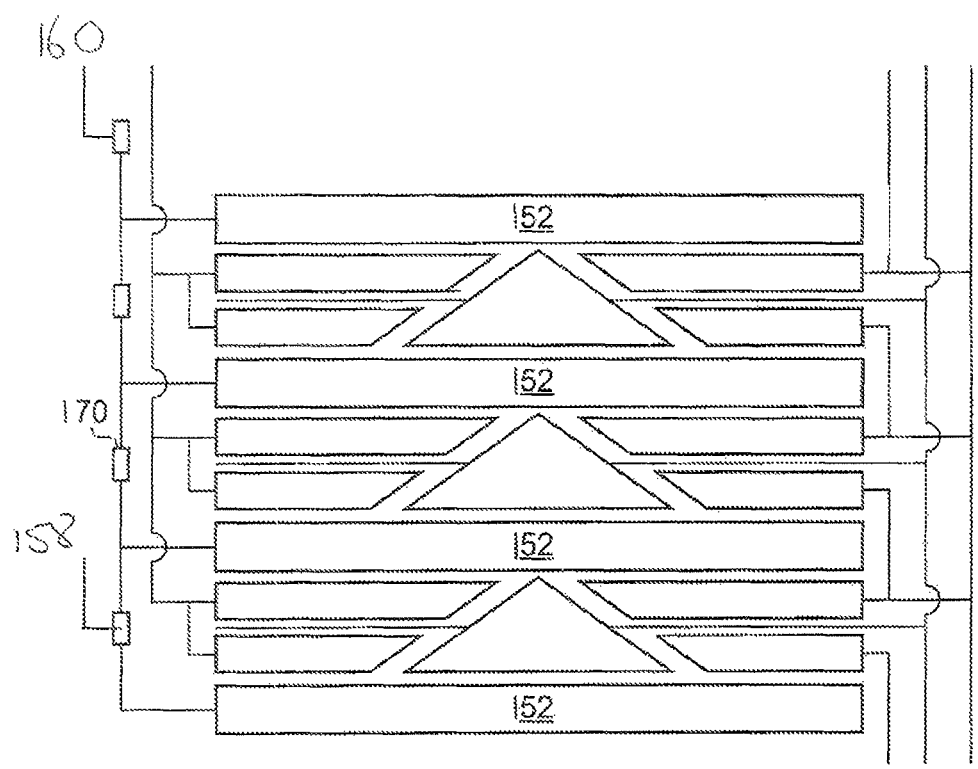
FIG. 22 illustrates schematically a representative portion of a prior art position sensor.

FIG. 20 schematically shows a cellular telephone 95 which may incorporate one or more sensors according to an embodiment of the invention. A two-dimensional sensor 98 according to the invention may be used to provide the button panel with buttons 99, or may be a separate sensor co-extensive with the button panel. For example, the button panel may be retained as a mechanical assembly and the sensor provided to allow drawing, writing or command gestures to be performed by the user over the button panel area, for example to compose text messages in Chinese or other Asian characters. The screen 97 may also be overlaid with a sensor according to the invention.

More generally the invention may be used in conjunction with any appliance having a human-machine interface. It is also possible to provide a sensor similar to those described above which is provided separately from a device/appliance which it may be used to control, for example to provide an upgrade to a pre-existing appliance. It is also possible to provide a generic sensor which may be configured to operate a range of different appliances. For example, a sensor may be provided that has programmable keys which a device/appliance provider may associate with desired functions by appropriately configuration, for example by reprogramming.

A capacitive position sensor has a two-layer electrode structure. Drive electrodes extending in a first direction on a first plane on one side of a substrate. Sense electrodes extend in a second direction on a second plane on the other side of the substrate so that the sense electrodes cross the drive electrodes at a plurality of intersections which collectively form a position sensing array. The sense electrodes are provided with branches extending in the first direction part of the way towards each adjacent sense electrode so that end portions of the branches of adjacent sense electrodes co-extend with each other in the first direction separated by a distance sufficiently small that capacitive coupling to the drive electrode adjacent to the co-extending portion is reduced. Providing sense electrode branches allow a sensor to be made which has a greater extent in the first direction for a given number of sense channels, since the co-extending portions provide an interpolating effect. The number of sense electrode branches per drive electrode can be increased which allows a sensor to be made which has ever greater extent in the first direction without having to increase the number of sense channels.

What is claimed is:

1. A sensor comprising:
a plurality of drive electrodes running generally in a first direction;
a plurality of sense electrodes running generally in a second direction, the sense electrodes having branches running generally in the first direction, the branches having a pitch that is greater than or equal to 1 millimeter and less than or equal to 8 millimeters;
wherein end portions of the branches of adjacent sense electrodes extend beyond one another to define respective coextensive portions of the branches and the coextensive portions of the branches of adjacent sense electrodes are separated by gaps that are greater than or equal to 5 micrometers and less than or equal to 50 micrometers.

2. The sensor of claim 1, wherein a first drive electrode comprises a conductive mesh.

3. The sensor of claim 1, wherein the pitch is.

4. The sensor of claim 1, wherein the gaps are greater than or equal to 10 micrometers and less than or equal to 30 micrometers.

5. The sensor of claim 1, wherein a coextensive portion of a first pair of branches is offset along the first axis from a coextensive portion of a second pair of branches.

6. The sensor of claim 1, further comprising a substrate and wherein the drive electrodes and the sense electrodes are coupled to the substrate.

* * * * *